(12) United States Patent
Benson

(10) Patent No.: US 11,342,336 B1
(45) Date of Patent: May 24, 2022

(54) INTEGRATED CIRCUITRY, MEMORY CIRCUITRY, METHOD USED IN FORMING INTEGRATED CIRCUITRY, AND METHOD USED IN FORMING MEMORY CIRCUITRY

(71) Applicant: Micron Technology, Inc., Boise, ID (US)

(72) Inventor: Russell A. Benson, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/166,342

(22) Filed: Feb. 3, 2021

(51) Int. Cl.
*H01L 27/108* (2006.01)

(52) U.S. Cl.
CPC .. *H01L 27/10885* (2013.01); *H01L 27/10814* (2013.01); *H01L 27/10823* (2013.01); *H01L 27/10852* (2013.01); *H01L 27/10876* (2013.01)

(58) Field of Classification Search
None
See application file for complete search history.

(56) References Cited

U.S. PATENT DOCUMENTS

| 2009/0176375 A1* | 7/2009 | Benson | C09K 13/00 438/719 |
| 2016/0093732 A1* | 3/2016 | Lee | H01L 29/7827 257/329 |

* cited by examiner

*Primary Examiner* — Steven M Christopher
(74) *Attorney, Agent, or Firm* — Well St. John P.S.

(57) ABSTRACT

A method used in forming integrated circuitry comprises forming horizontally-spaced conductive vias above a substrate. Conducting material is formed directly above and directly against the conductive vias. The conducting material is patterned to form individual conductive lines that are individually directly above a plurality of the conductive vias that are spaced longitudinally-along the respective individual conductive line. The patterning forms the individual conductive lines to have longitudinally-alternating wider and narrower regions. The wider regions are directly above and directly against a top surface of individual of the conductive vias and are wider in a horizontal cross-section that is at the top surface than are the narrower regions in the horizontal cross-section. The narrower regions are longitudinally-between the wider regions. Other embodiments, including structure independent of method, are disclosed.

15 Claims, 24 Drawing Sheets

INTEGRATED CIRCUITRY, MEMORY CIRCUITRY, METHOD USED IN FORMING INTEGRATED CIRCUITRY, AND METHOD USED IN FORMING MEMORY CIRCUITRY

TECHNICAL FIELD

Embodiments disclosed herein pertain to integrated circuitry, to memory circuitry, method used in forming integrated circuitry, and method used in forming memory circuitry.

BACKGROUND

Memory is one type of integrated circuitry and is used in computer systems for storing data. Memory may be fabricated in one or more arrays of individual memory cells. Memory cells may be written to, or read from, using digitlines (which may also be referred to as bitlines, data lines, or sense lines) and access lines (which may also be referred to as wordlines). The digitlines may conductively interconnect memory cells along columns of the array, and the access lines may conductively interconnect memory cells along rows of the array. Each memory cell may be uniquely addressed through the combination of a digitline and an access line.

Memory cells may be volatile, semi-volatile, or non-volatile. Non-volatile memory cells can store data for extended periods of time in the absence of power. Non-volatile memory is conventionally specified to be memory having a retention time of at least about 10 years. Volatile memory dissipates and is therefore refreshed/rewritten to maintain data storage. Volatile memory may have a retention time of milliseconds or less. Regardless, memory cells are configured to retain or store memory in at least two different selectable states. In a binary system, the states are considered as either a "0" or a "1". In other systems, at least some individual memory cells may be configured to store more than two levels or states of information.

A capacitor is one type of electronic component that may be used in a memory cell. A capacitor has two electrical conductors separated by electrically insulating material. Energy as an electric field may be electrostatically stored within such material. Depending on composition of the insulator material, that stored field will be volatile or non-volatile. For example, a capacitor insulator material including only $SiO_2$ will be volatile. One type of non-volatile capacitor is a ferroelectric capacitor which has ferroelectric material as at least part of the insulating material. Ferroelectric materials are characterized by having two stable polarized states and thereby can comprise programmable material of a capacitor and/or memory cell. The polarization state of the ferroelectric material can be changed by application of suitable programming voltages and remains after removal of the programming voltage (at least for a time). Each polarization state has a different charge-stored capacitance from the other, and which ideally can be used to write (i.e., store) and read a memory state without reversing the polarization state until such is desired to be reversed. Less desirable, in some memory having ferroelectric capacitors the act of reading the memory state can reverse the polarization. Accordingly, upon determining the polarization state, a re-write of the memory cell is conducted to put the memory cell into the pre-read state immediately after its determination. Regardless, a memory cell incorporating a ferroelectric capacitor ideally is non-volatile due to the bi-stable characteristics of the ferroelectric material that forms a part of the capacitor. Other programmable materials may be used as a capacitor insulator to render capacitors non-volatile.

A field effect transistor is another type of electronic component that may be used in a memory cell. These transistors comprise a pair of conductive source/drain regions having a semiconductive channel region there-between. A conductive gate is adjacent the channel region and separated there-from by a thin gate insulator. Application of a suitable voltage to the gate allows current to flow from one of the source/drain regions to the other through the channel region. When the voltage is removed from the gate, current is largely prevented from flowing through the channel region. Field effect transistors may also include additional structure, for example a reversibly programmable charge-storage region as part of the gate construction between the gate insulator and the conductive gate. Regardless, the gate insulator may be programmable, for example being ferroelectric.

Capacitors and transistors may of course be used in integrated circuitry other than memory circuitry. Regardless, a conductive via is an elevationally-extending (e.g., vertical) conductor that is used to electrically connect capacitors, transistors, and other integrated circuitry components together. Such may be patterned in an array. As conductive vias get closer and closer to adjacent circuit components, undesired parasitic capacitance increases and can adversely impact circuit operation. Further, in the fabrication of such conductive vias, pattern misalignment and/or artifact(s) of manufacture can result in conductive vias undesired shorting to adjacent circuit components that can destroy some or all of the integrated circuitry being fabricated.

DETAILED DESCRIPTION OF EXAMPLE EMBODIMENTS

Embodiments of the invention encompass integrated circuitry constructions, such as DRAM constructions, and methods used in forming an integrated circuitry construction, such as a DRAM circuitry construction. First example embodiments comprising a DRAM construction are described with reference to FIGS. 1-7 showing an example fragment of a substrate construction 8 comprising an array or array area 10 that has been fabricated relative to a base substrate 11. Substrate construction 11 may comprise any one or more of conductive/conductor/conducting, semiconductive/semiconductor/semiconducting, and insulative/insulator/insulating (i.e., electrically herein) materials. Various materials are above base substrate 11. Materials may be aside, elevationally inward, or elevationally outward of the FIGS. 1-7-depicted materials. For example, other partially or wholly fabricated components of integrated circuitry may be provided somewhere above, about, or within base substrate 11. Control and/or other peripheral circuitry for operating components within a memory array may also be fabricated and may or may not be wholly or partially within a memory array or sub-array. Further, multiple sub-arrays may also be fabricated and operated independently, in tandem, or otherwise relative one another. As used in this document, a "sub-array" may also be considered as an array.

Figure 1:
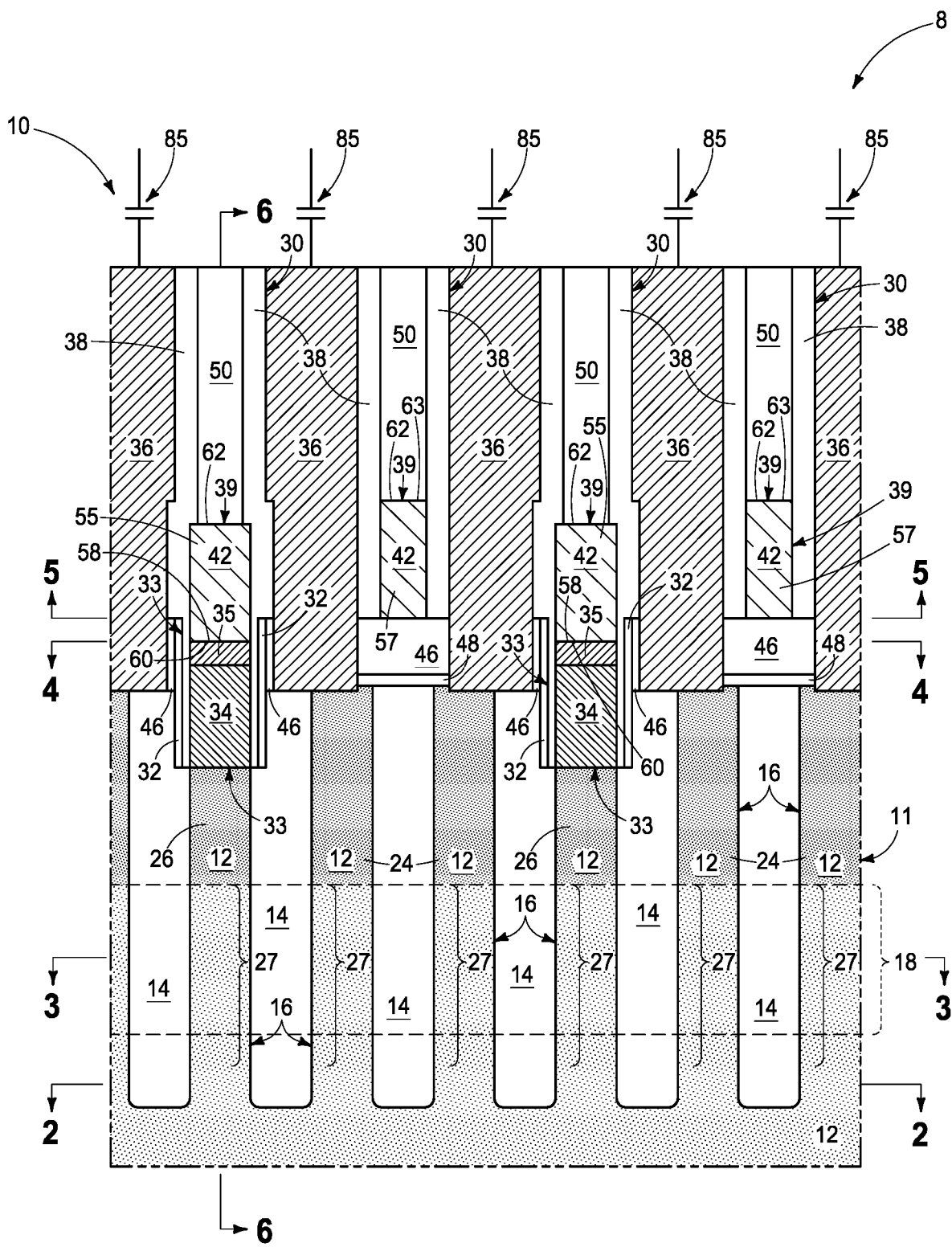
FIGS. 1-7 are diagrammatic cross-sectional views of a portion of a DRAM construction in process in accordance with some embodiments of the invention.
Figure 2:
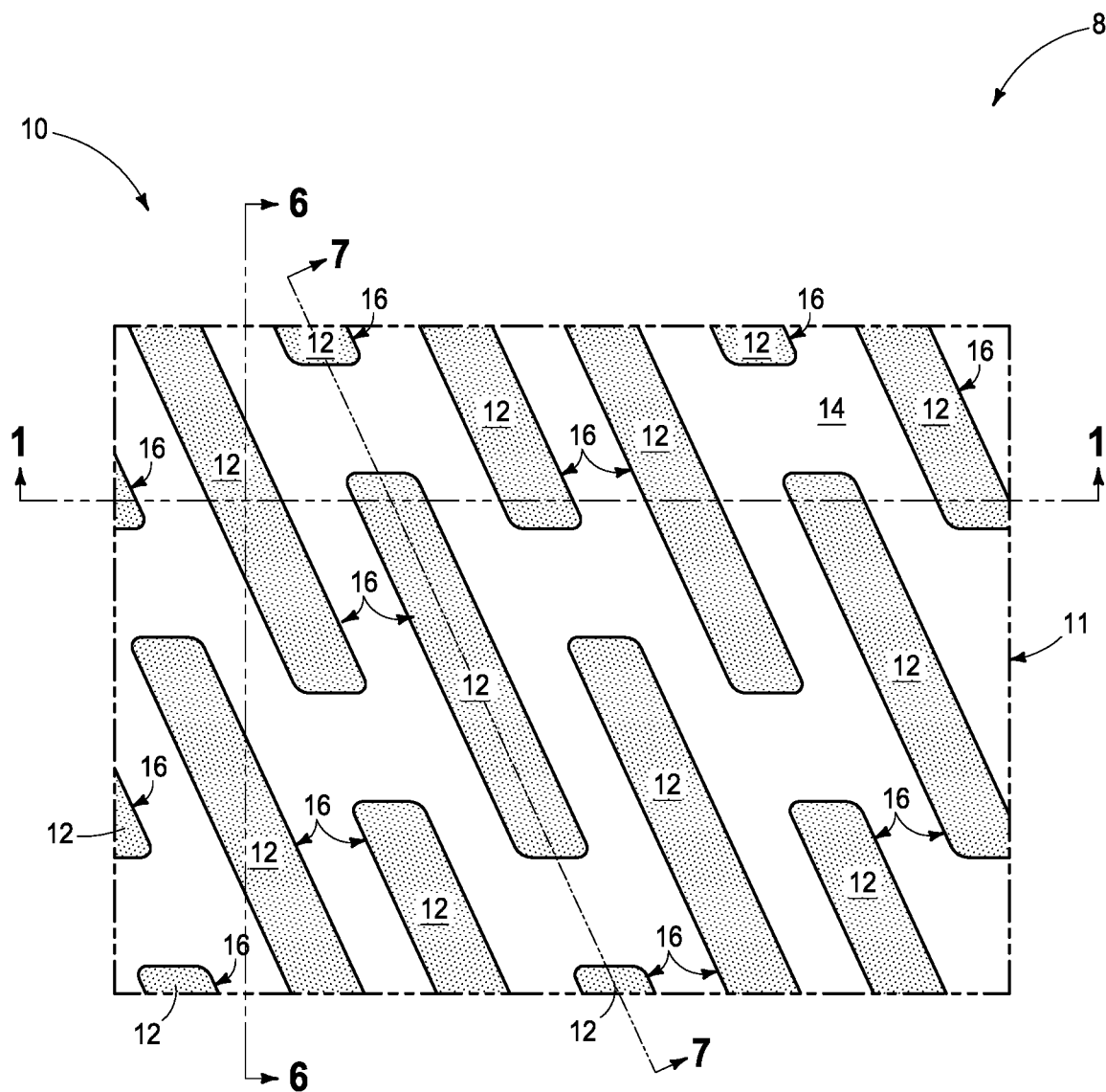
Figure 3:
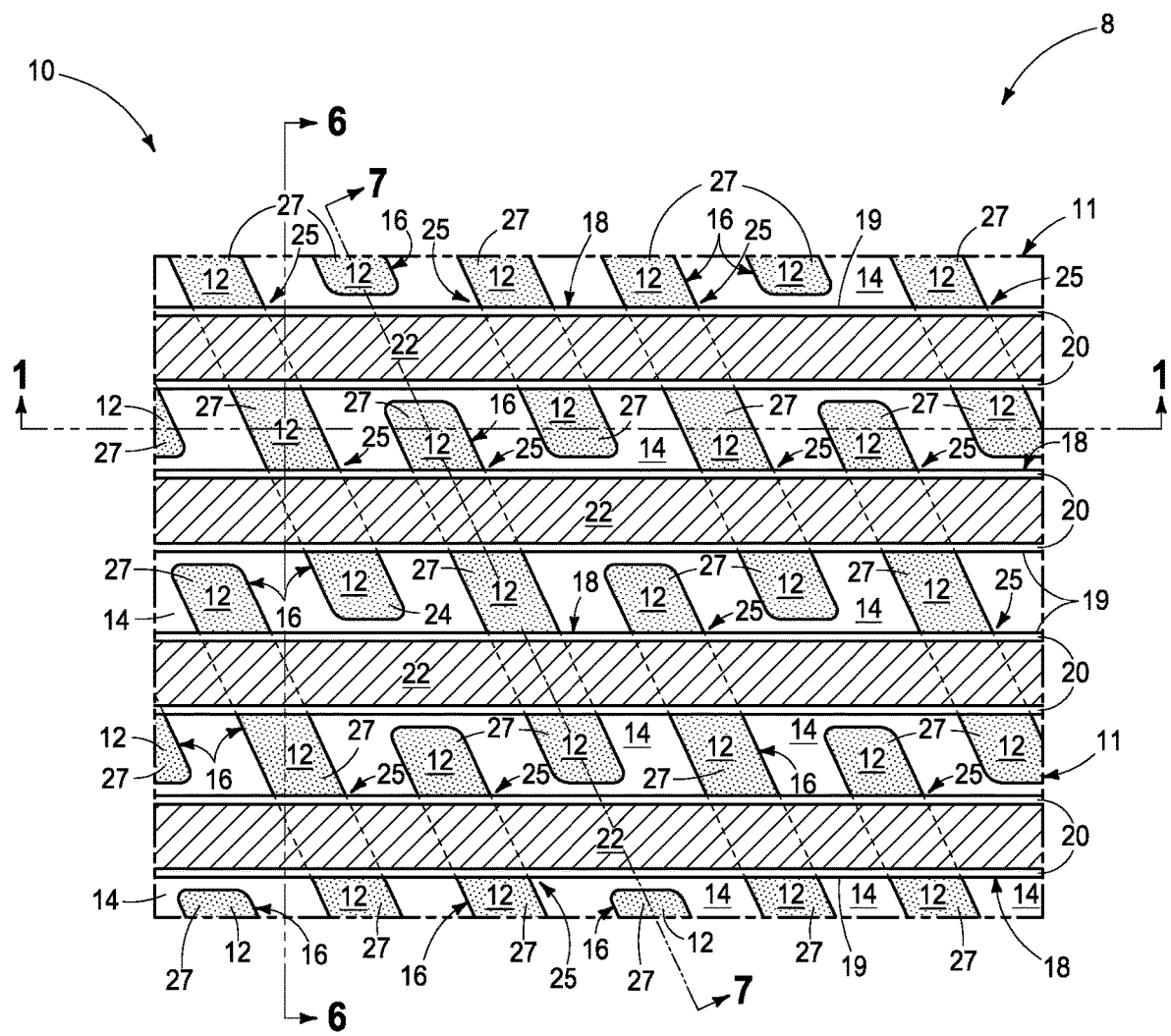
Figure 4:
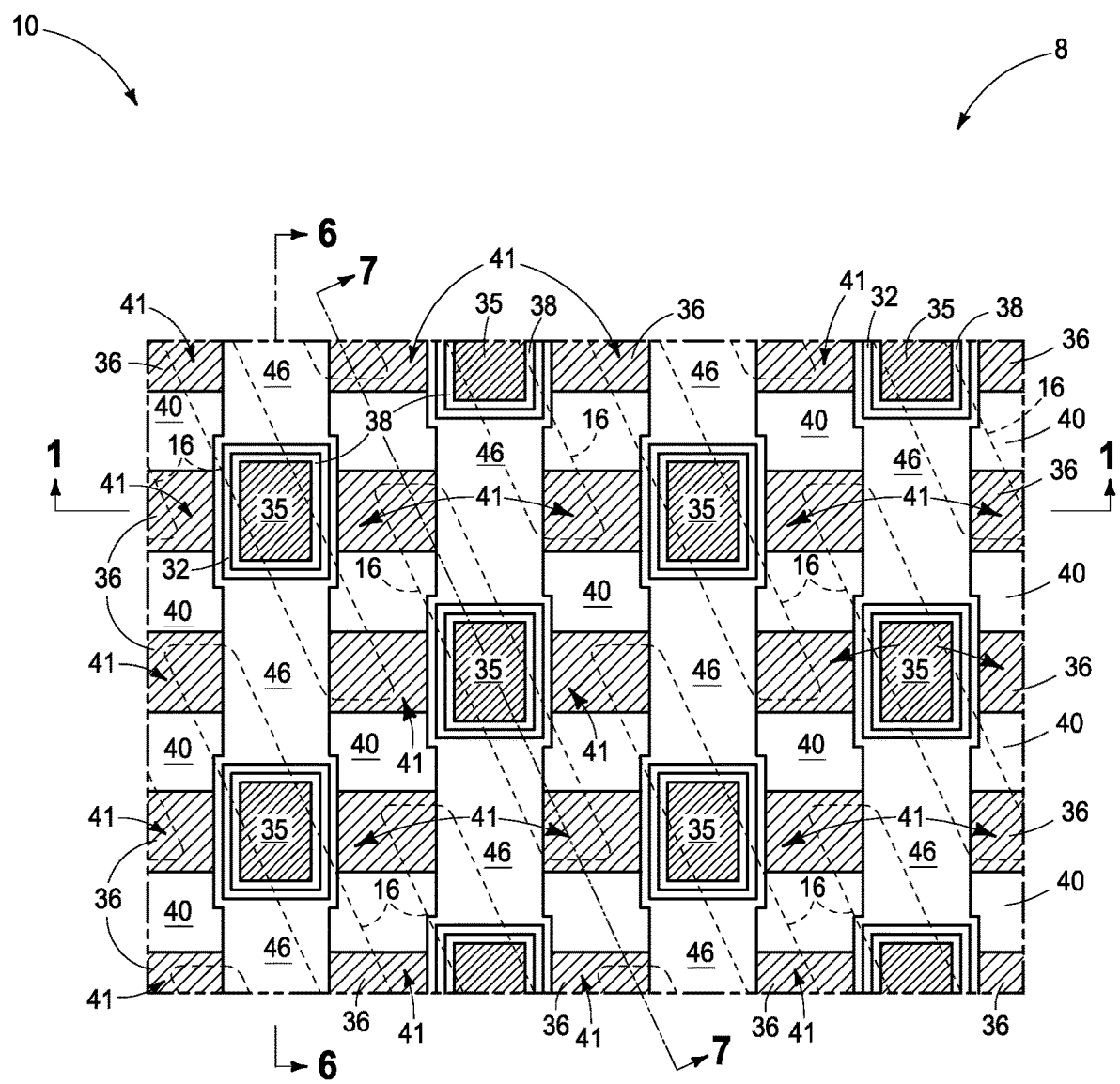
Figure 5:
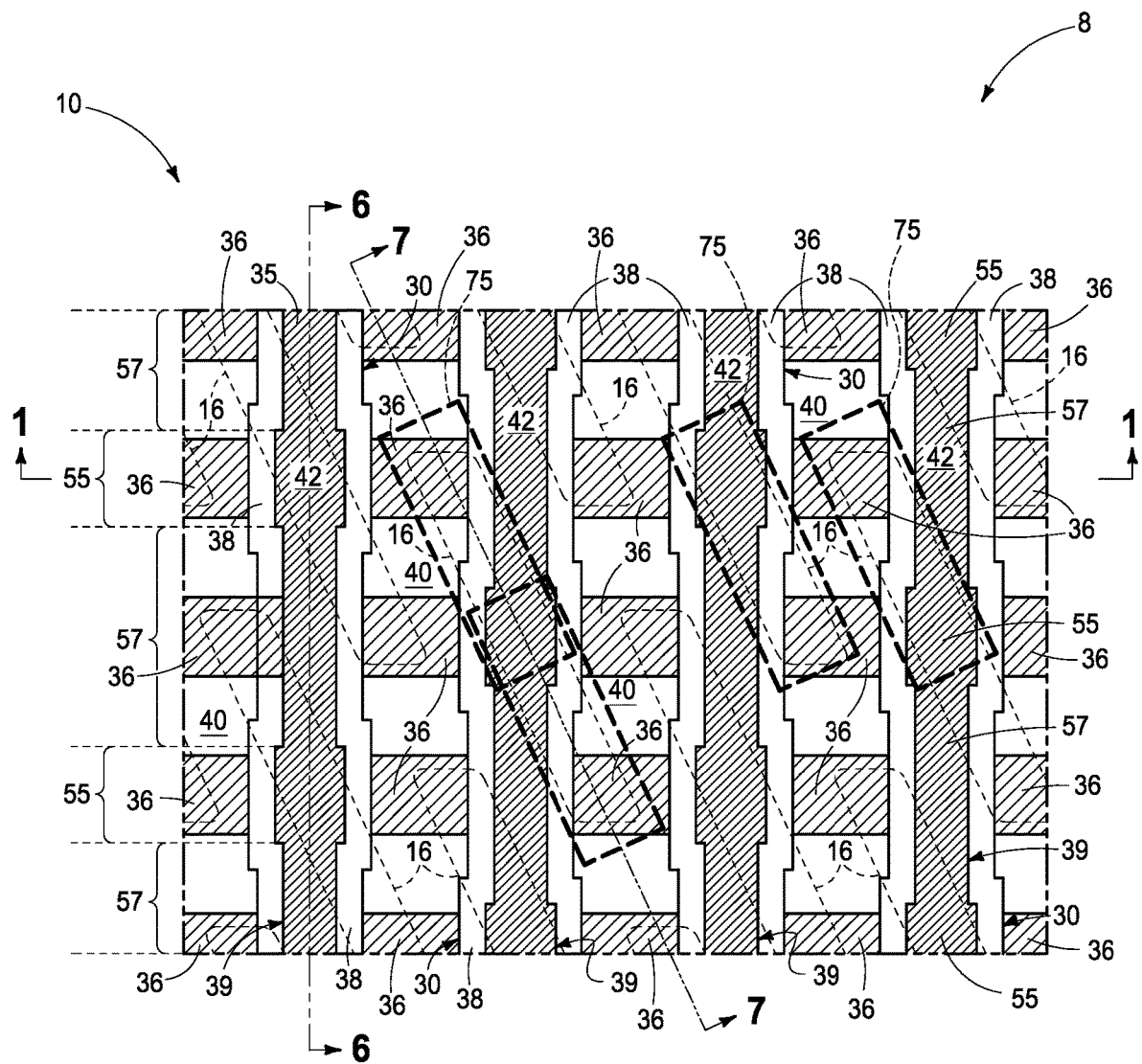
Figure 7:
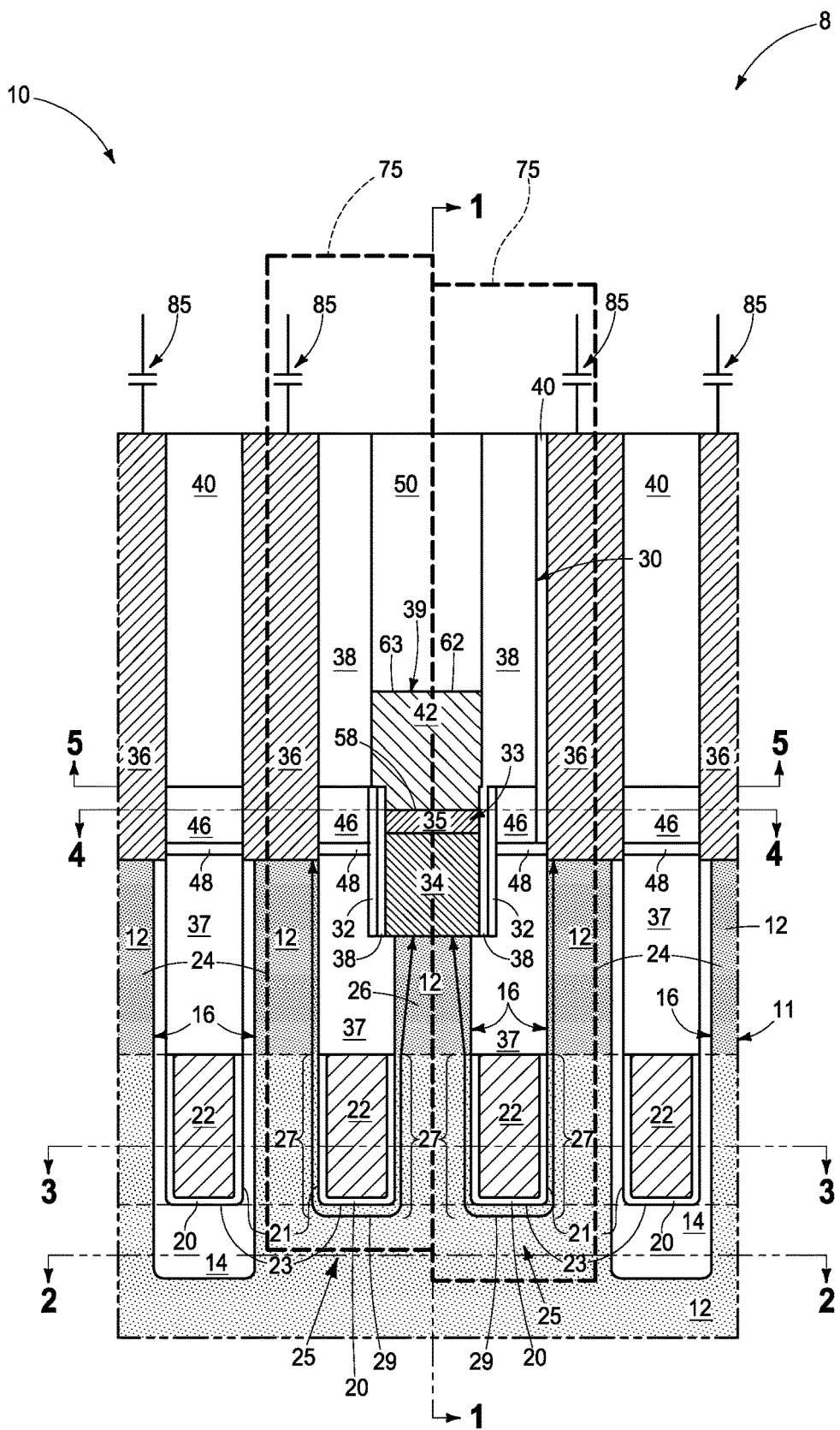

Base substrate 11 comprises semiconductive material 12 (e.g., appropriately and variously doped monocrystalline and/or polycrystalline silicon, Ge, SiGe, GaAs, and/or other existing or future-developed semiconductive material), trench isolation regions 14 (e.g., silicon nitride and/or silicon dioxide), and active area regions 16 comprising suitably and variously-doped semiconductive material 12. In one embodiment, construction 8 comprises memory cells 75 (FIGS. 5 and 7, and with only four outlines 75 shown in FIG. 5 and only two outlines 75 in FIG. 7 for clarity in such figures), for example DRAM memory cells individually comprising a field effect transistor device 25 (FIG. 3) and a storage element (e.g., a capacitor 85; FIGS. 1 and 7). However, embodiments of the invention encompass other memory cells and other constructions of integrated circuitry independent of whether containing memory cells.

Example transistor devices 25 individually comprise a pair of source/drain regions, a channel region between the pair of source/drain regions, a conductive gate operatively proximate the channel region, and a gate insulator between the conductive gate and the channel region. Devices 25 are shown as being recessed access devices, with example construction 8 showing such recessed access devices grouped in individual pairs of such devices. Individual recessed access devices 25 include a buried access line construction 18, for example that is within a trench 19 in semiconductive material 12. Constructions 18 comprise conductive gate material 22 (e.g., conductively-doped semiconductor material and/or metal material, including for example elemental W, Ru, and/or Mo) that functions as a conductive gate of individual devices 25. A gate insulator 20 (e.g., silicon dioxide and/or silicon nitride) is along sidewalls 21 and a base 23 of individual trenches 19 between conductive gate material 22 and semiconductive material 12. Insulator material 37 (e.g., silicon dioxide and/or silicon nitride) is within trenches 19 above materials 20 and 22. Individual devices 25 comprise a pair of source/drain regions 24, 26 in upper portions of semiconductive material 12 on opposing sides of individual trenches 19 (e.g., regions 24, 26 being laterally outward of and higher than access line constructions 18). Each of source/drain regions 24, 26 has at least a part thereof having a conductivity-increasing dopant therein that is of maximum concentration of such conductivity-increasing dopant within the respective source/drain region 24, 26, for example to render such part to be conductive (e.g., having a maximum dopant concentration of at least $10^{19}$ atoms/cm$^3$). Accordingly, all or only a part of each source/drain region 24, 26 may have such maximum concentration of conductivity-increasing dopant. Source/drain regions 24 and/or 26 may include other doped regions (not shown), for example halo regions, LDD regions, etc.

One of the source/drain regions (e.g., region 26) of the pair of source/drain regions in individual of the pairs of recessed access devices 25 is laterally between conductive gate material 22 and is shared by the pair of devices 25. Others of the source/drain regions (e.g., regions 24) of the pair of source/drain regions are not shared by the pair of devices 25. Thus, in the example embodiment, each active area region 16 comprises two devices 25 (e.g., one pair of devices 25), with each sharing a central source/drain region 26.

An example channel region 27 (FIGS. 1, 3, 6, and 7) is in semiconductive material 12 below pair of source/drain regions 24, 26 along trench sidewalls 21 (FIGS. 6 and 7) and around trench base 23. Channel region 27 may be undoped or may be suitably doped with a conductivity-increasing dopant likely of the opposite conductivity-type of the dopant in source/drain regions 24, 26, and for example that is at a maximum concentration in the channel of no greater than $1 \times 10^{17}$ atoms/cm$^3$. When suitable voltage is applied to gate material 22 of an access line construction 18, a conductive channel forms (e.g., along a channel current-flow line/path 29 [FIG. 7]) within channel region 27 proximate gate insulator 20 such that current is capable of flowing between a pair of source/drain regions 24 and 26 under the access line construction 18 within an individual active area region 16. Stippling is diagrammatically shown to indicate primary conductivity-modifying dopant concentration (regardless of type), with denser stippling indicating greater dopant concentration and lighter stippling indicating lower dopant concentration. Conductivity-modifying dopant may be, and would likely be, in other portions of material 12 as shown. Only two different stippling densities are shown in material 12 for convenience, and additional dopant concentrations may be used, and constant dopant concentration is not required in any region.

Horizontally-spaced conductive vias 33 are individually directly electrically coupled to one of the pair of source/drain regions (e.g., 26) of multiple of the transistors. Example conductive vias 33 are spaced relative one another (e.g., longitudinally relative to a digitline 39 there-above as described below) by intermediate material (e.g., one or more of materials 38, 32, and/or 46 when present, with materials 38, 32, and 46 being described below) and comprise conductive material (e.g., 34 and 35). In one embodiment, conductive material 34/35 of conductive vias 33 comprises lower conductively-doped semiconductive material 34 (e.g., conductively-doped polysilicon) below upper conductive material 35 (e.g., metal material) that is of different composition from that of conductively-doped semiconductive material 34. Additional example conductive materials for materials 34 and 35, and by way of examples only, comprise metal nitrides (e.g., TiN, TaN, WN, MoN), metal carbonitrides (e.g., TiCN, TaCN, WCN, MoCN), and elemental-form metals (e.g., Ti, Ta, W, Mo, Co, Cu, Ru, Be) including combinations, compounds, and alloys thereof.

Figure 6:
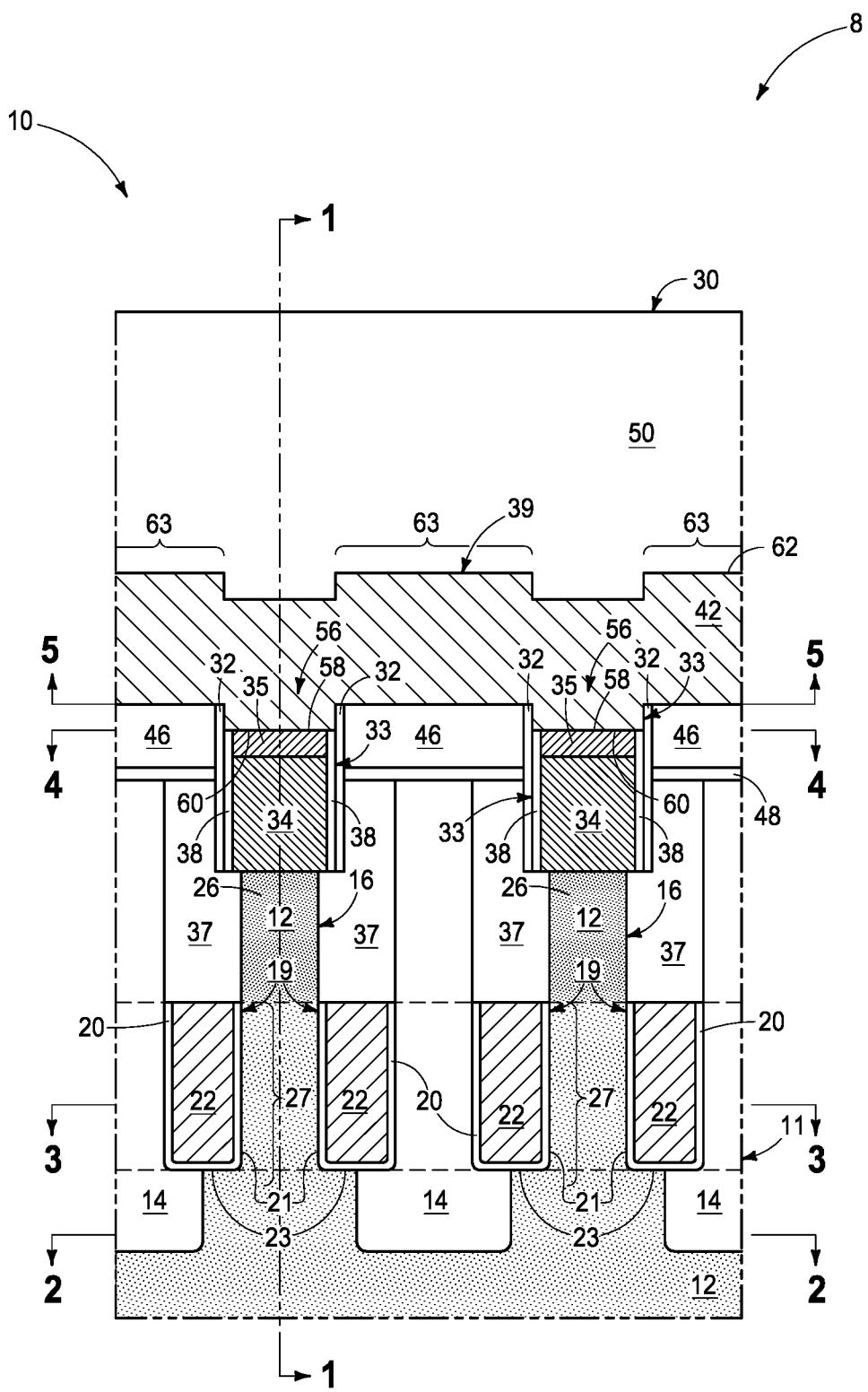

A digitline 39 is directly electrically coupled to a plurality of conductive vias 33 along a line of multiple of transistors 25. Digitline 39 comprises conducting material 42 that is directly against conductive material 34/35 of conductive vias 33. Example digitlines 39 comprise part of digitline structures 30 that comprises opposing longitudinal insulative sides 38 (e.g., silicon dioxide and/or silicon nitride) and an insulative cap 50 (e.g., silicon nitride and/or silicon dioxide). Example material 46 is below digitlines 39 between immediately-longitudinally-adjacent conductive vias 33 (FIG. 6). Lower insulative material 48 (e.g., one or more of silicon dioxide, silicon nitride, aluminum dioxide, hafnium oxide, etc.; e.g., thickness of 50 to 200 Angstroms) is below material 46 between immediately-longitudinally-adjacent conductive vias 33. Material 46 may be insulative, semiconductive (e.g., material that is not sufficiently doped to be conductive), or conductive or be eliminated, with conducting material 42 extending inwardly to lower insulative material 48 (not shown).

Individual of digitline structures 30 have longitudinally-alternating wider and narrower regions (e.g., 55 and 57, respectively) of conducting material (e.g., 42). Wider regions 55 are directly above and directly against a top surface (e.g., 58) of individual conductive vias 33 and are wider in a horizontal cross-section (e.g., that of FIG. 5) that is at top surface 58 than are narrower regions 57 in the horizontal cross-section, with narrower regions 57 being longitudinally-between wider regions 55.

In one embodiment, individual digitlines 39 have lower bottom surfaces 60 directly above conductive vias 33 than there-between longitudinally along the respective individual digitline 39. In one embodiment, individual digitlines 39 have an undulating top surface 62 (FIGS. 1, 6, and 7). In one such embodiment, highest portions 63 of undulating top surface 62 are directly above narrower regions 57 and in one such embodiment highest portions 63 are not directly above wider regions 55.

Conductor vias 36 are laterally between and spaced longitudinally along digitline structures 30. Individual of conductor vias 36 are directly electrically coupled to the other source/drain region (e.g., 24) of the pair of source/drain regions of the multiple transistors. A plurality of storage elements (e.g., capacitor 85) are directly electrically coupled to individual conductor vias 36. For convenience and clarity, components 33, 30, 36, etc. are shown as having vertical sidewalls, although such may taper inwardly or outwardly moving deeper into the depicted stack (not shown).

Any other attribute(s) or aspect(s) as shown and/or described herein with respect to other embodiments may be used in the embodiments shown and described with reference to the above embodiments.

Embodiments of the invention encompass integrated circuitry that may or may not be or comprise memory circuitry. Integrated circuitry in accordance with the invention comprises horizontally-spaced conductive vias (e.g., 33) above a substrate (e.g., those portions of materials 12 and 14 that are below conductive vias 33). A plurality of conductive lines (e.g., 39) are individually directly above a plurality of the conductive vias that are spaced longitudinally-along the respective individual conductive line. Individual of the conductive lines have longitudinally-alternating wider regions (e.g., 55) and narrower regions (e.g., 57). The wider regions are directly above and directly against a top surface (e.g., 58) of individual of the conductive vias and are wider in a horizontal cross-section (e.g., that of FIG. 5) that is at the top surface than are the narrower regions in the horizontal cross-section, with the narrower regions being longitudinally-between the wider regions. Any other attribute(s) or aspect(s) as shown and/or described herein with respect to other embodiments may be used.

Embodiments of the invention encompass methods used in forming an integrated circuitry construction, for example comprising DRAM, other memory, and/or non-memory circuitry. Regardless, method aspects of the invention may use or have any of the attributes as described herein in structure and/or device embodiments. Likewise, the above-described structure embodiments may incorporate any of the attributes described with respect to method embodiment aspects.

Figure 8:
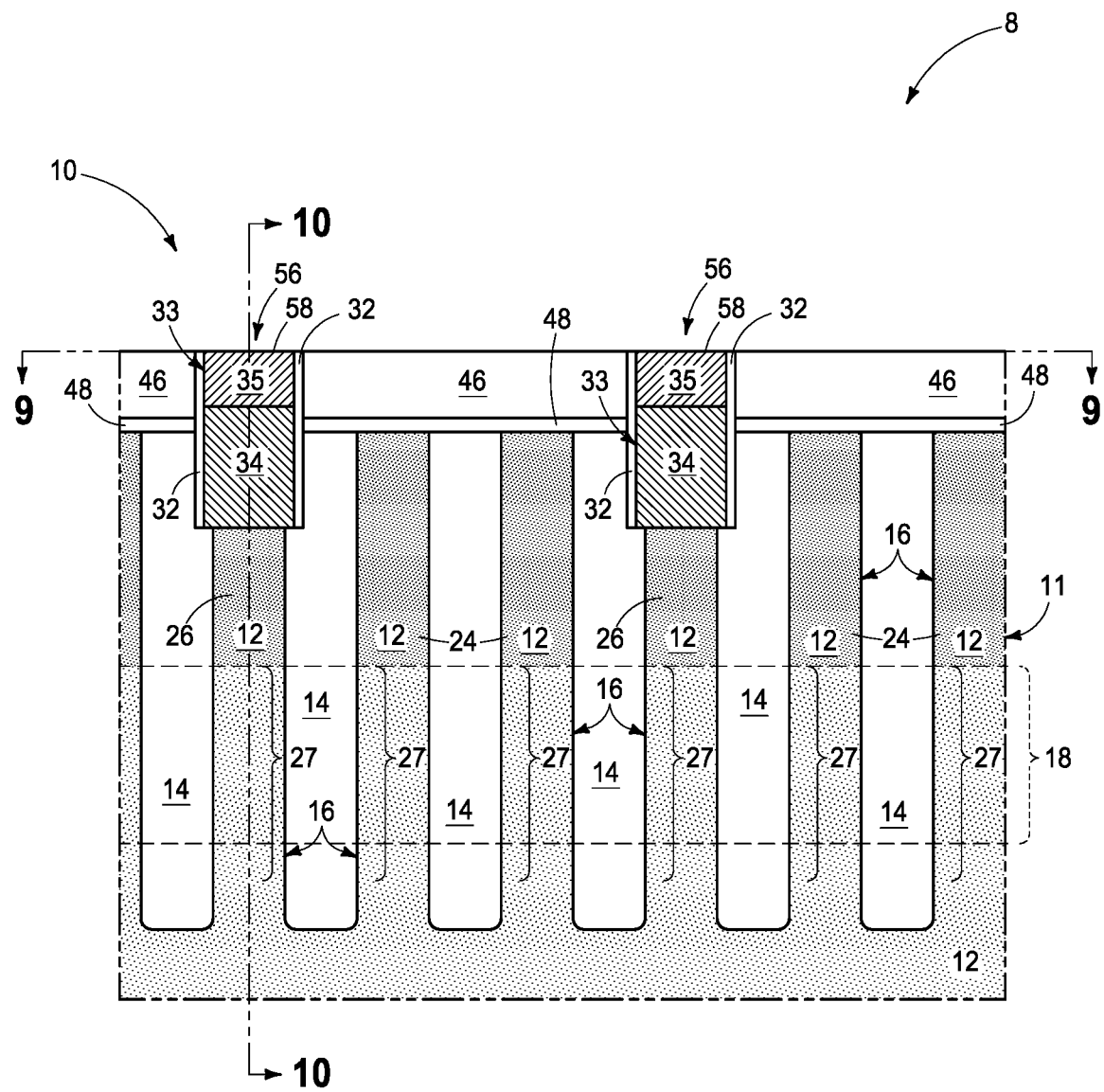
FIGS. 8-24 are diagrammatic sequential sectional views of the construction of FIGS. 1-7 in process in accordance with some embodiments of the invention.
Figure 9:
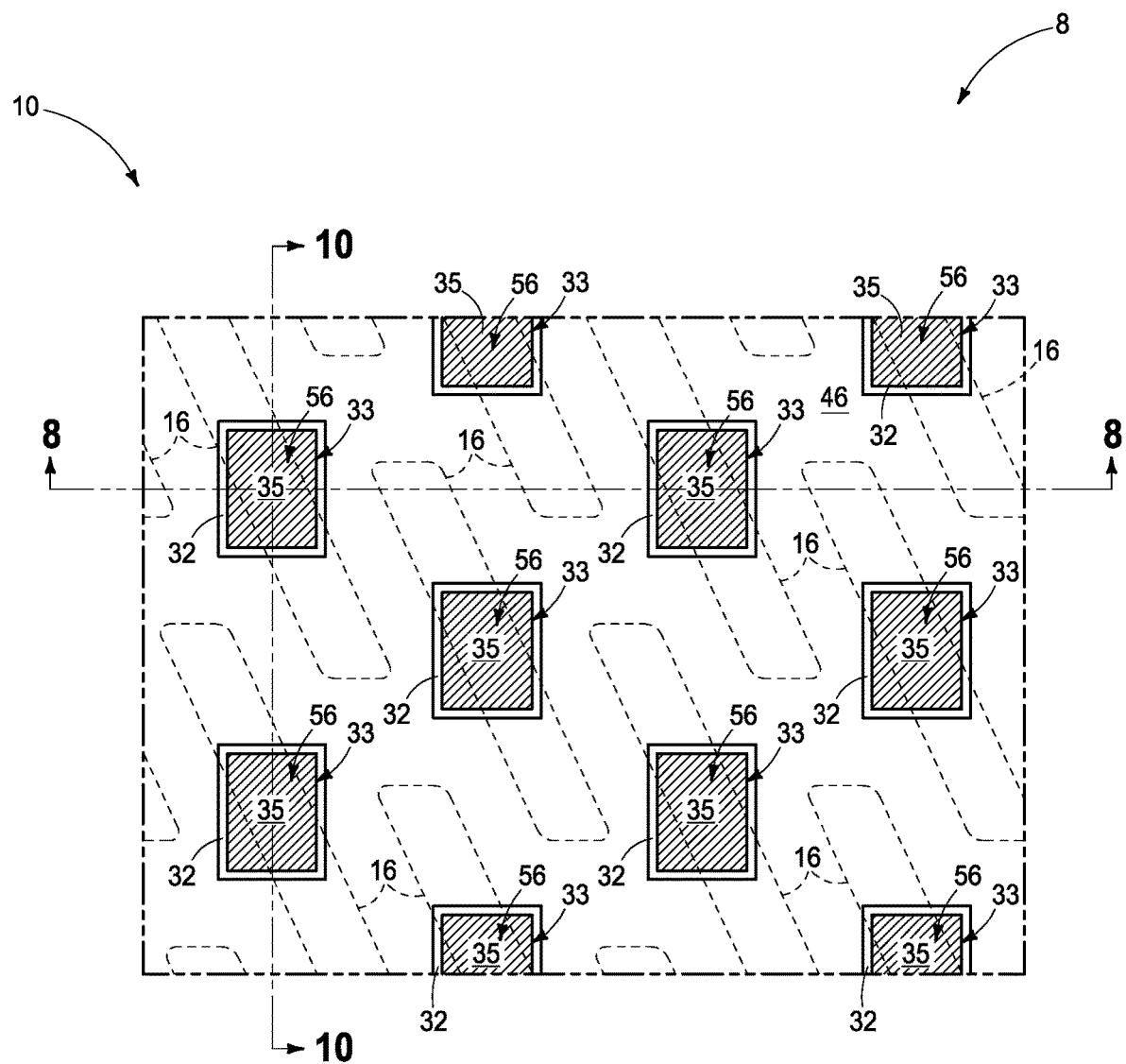
Figure 10:
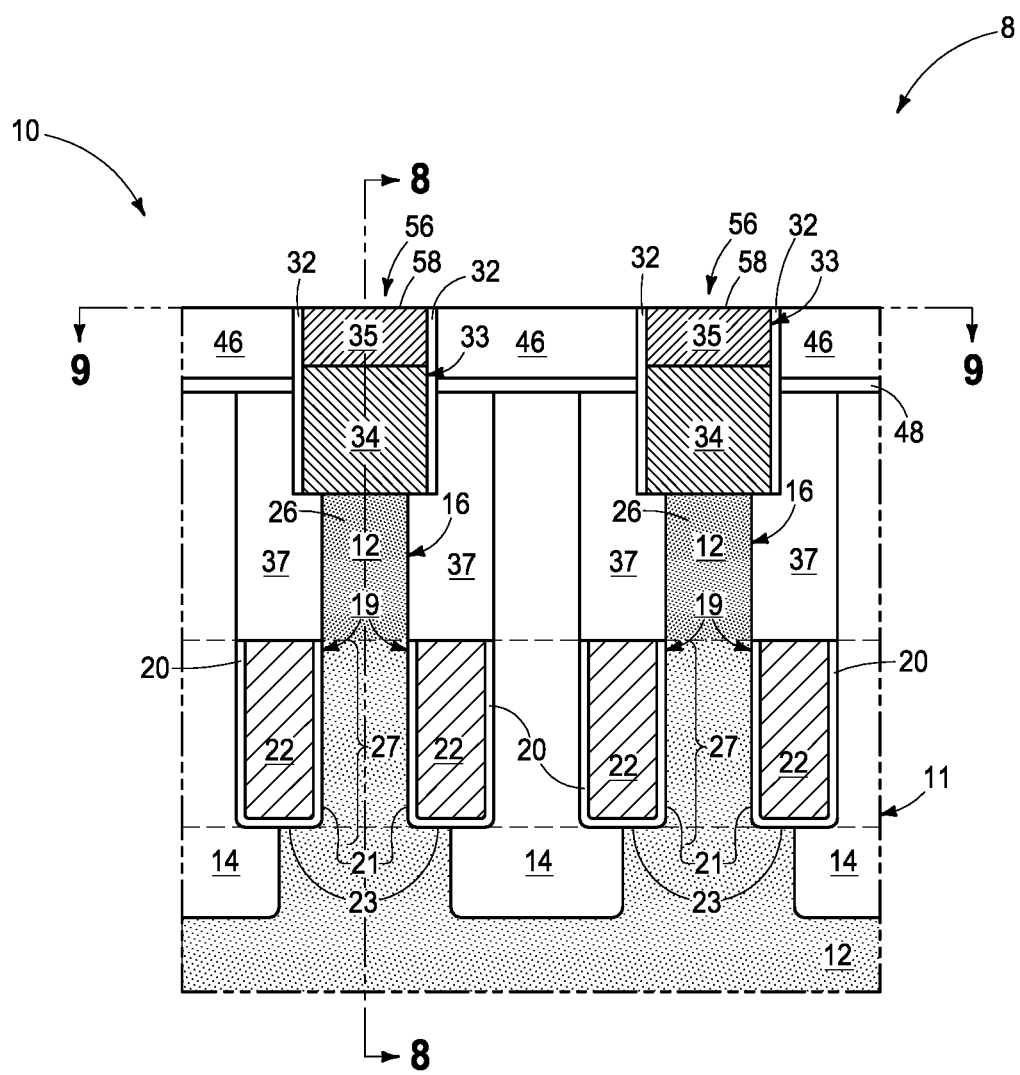

An example method embodiment, and an example such embodiment for producing construction 8 of FIGS. 1-7, is described with reference to FIGS. 8-24. Referring to FIGS. 8, 9, and 10, such show a predecessor construction to that of FIGS. 1, 4, and 6, respectively, where construction 8 has been fabricated to a point of comprising materials 32, 34, and 35 within array 10. Openings 56 have been formed to source/drain regions 26. Further, FIGS. 8-10 show prior formation (in one embodiment) of transistors 25 that individually comprise a pair of source/drain regions 24, 26, a channel region 27 between pair of source/drain regions 24, 26, and a conductive gate (e.g., conductive material 22) operatively proximate channel region 27. Further, and in one embodiment, horizontally-spaced conductive vias 33 have been formed that are individually directly electrically coupled to one of the pair of source/drain regions (e.g., source/drain region 26) of multiple of transistors 25.

Figure 11:
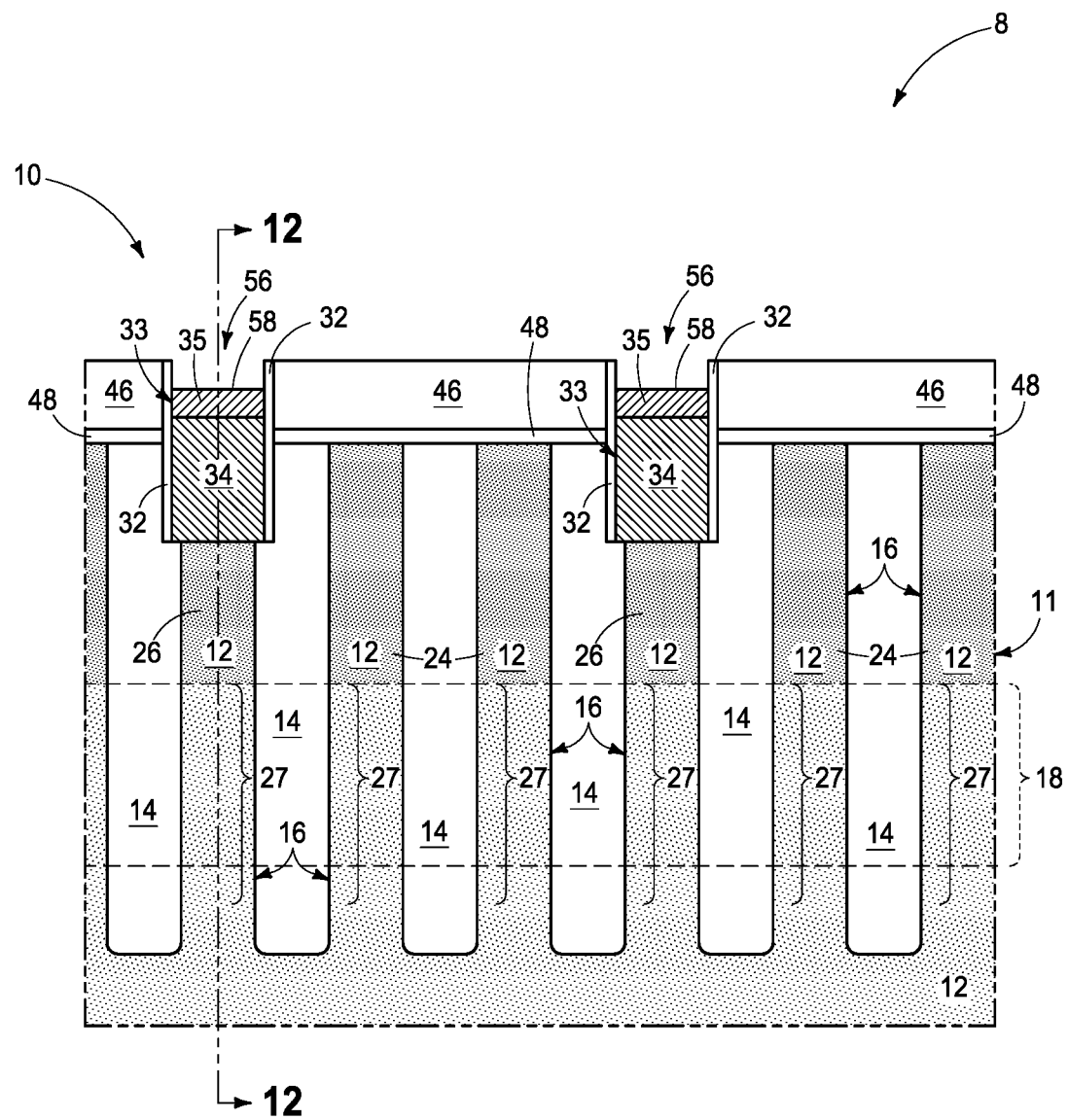
Figure 12:
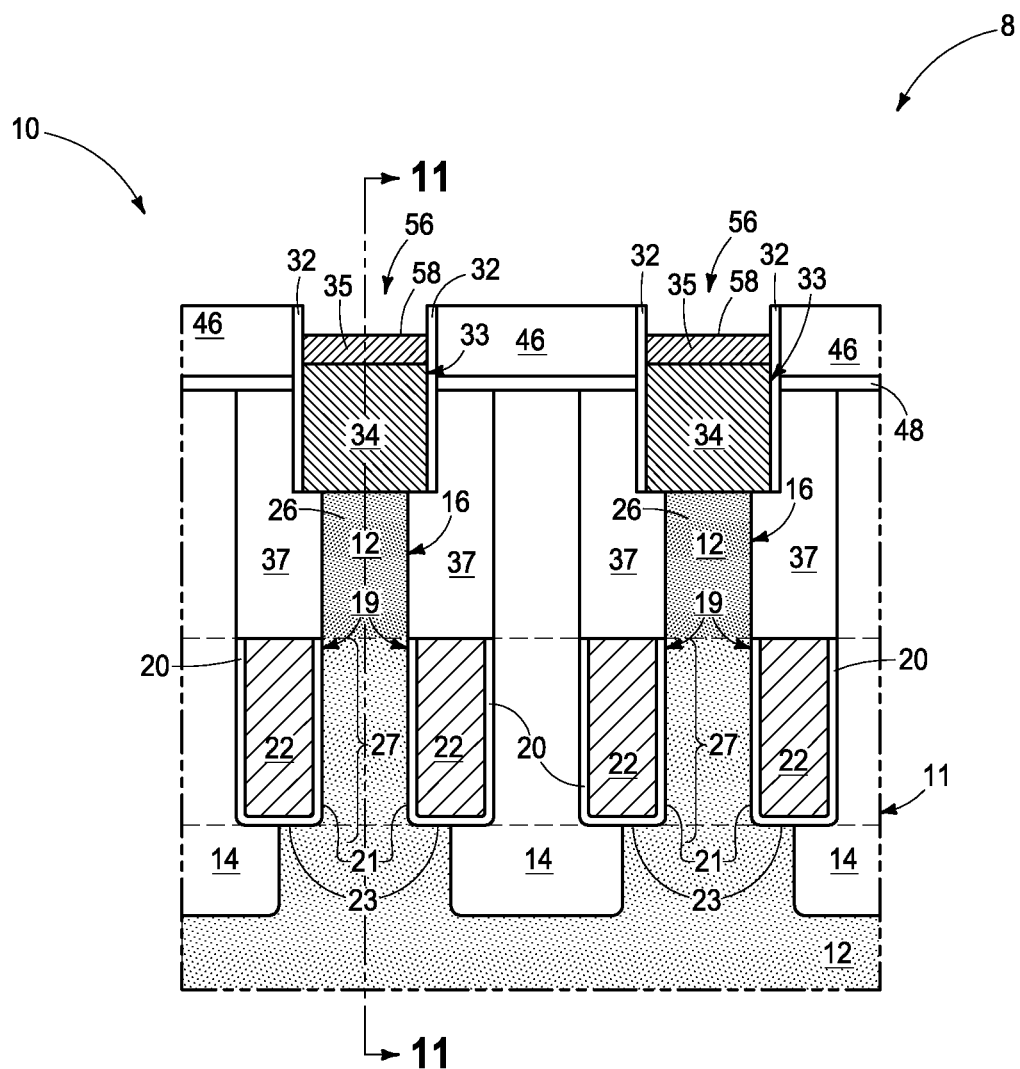

Referring to FIGS. 11 and 12, conductive vias 33 have been vertically recessed (e.g., conductive material 35 thereof and by chemical etching) to individually have a top surface 58 thereof that is lower than that of laterally-surrounding material (e.g., 32 or 46).

Figure 13:
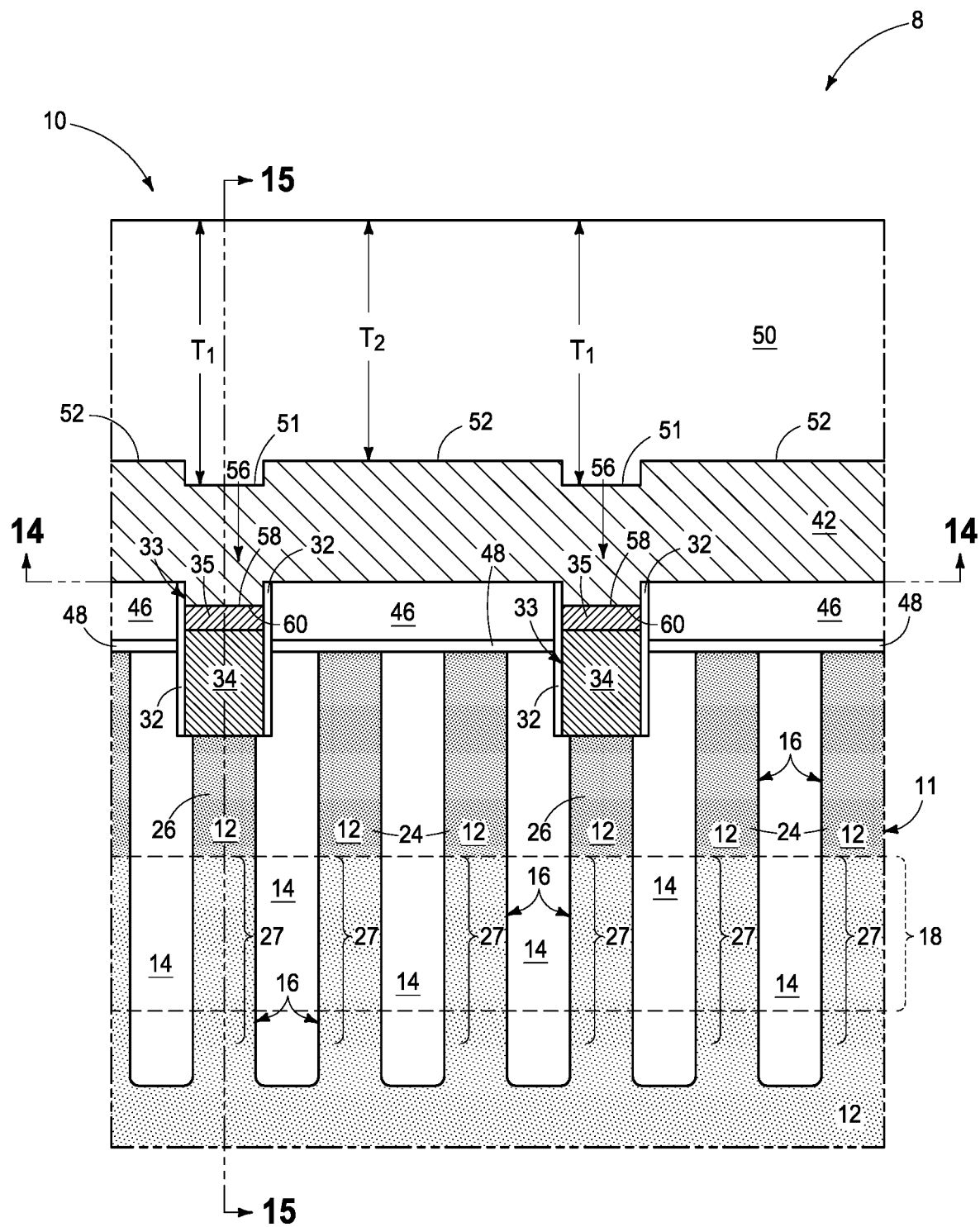
Figure 14:
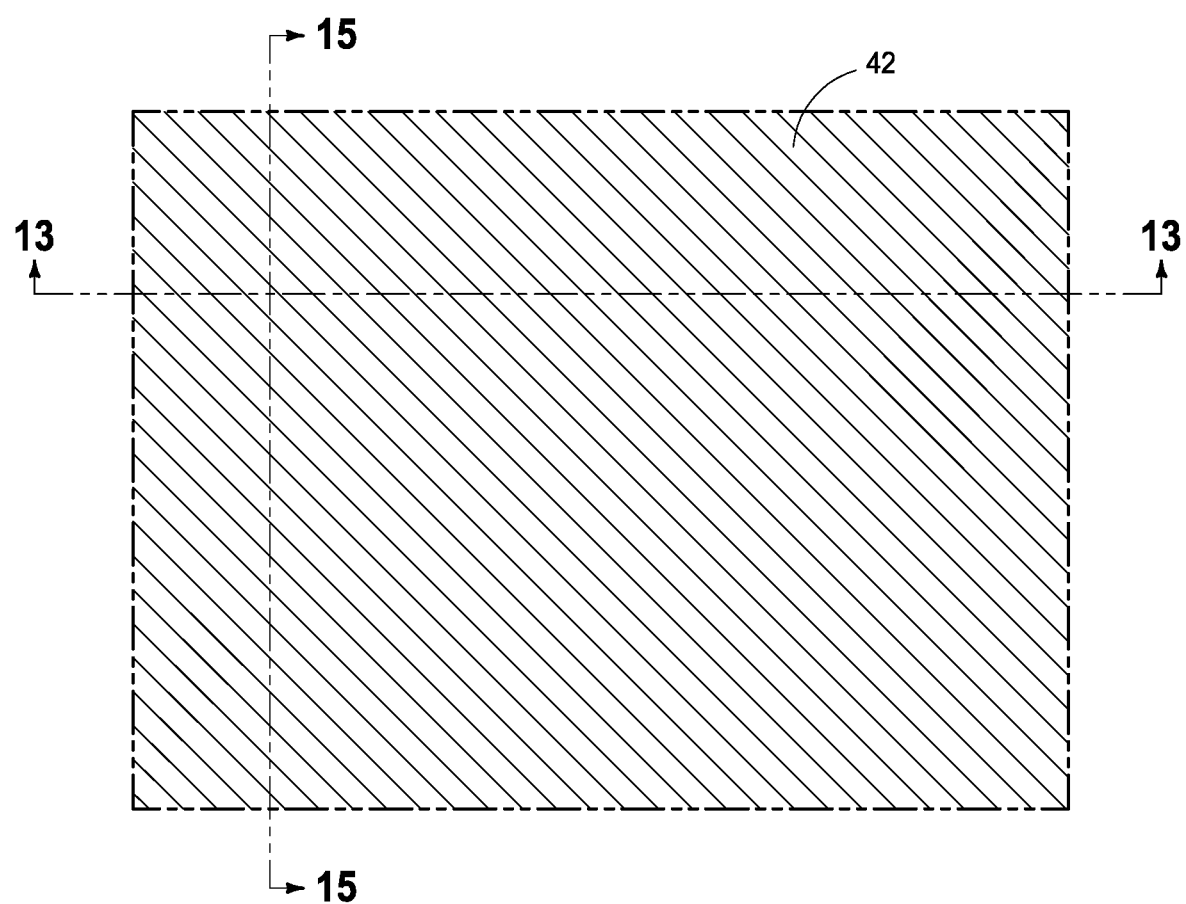
Figure 15:
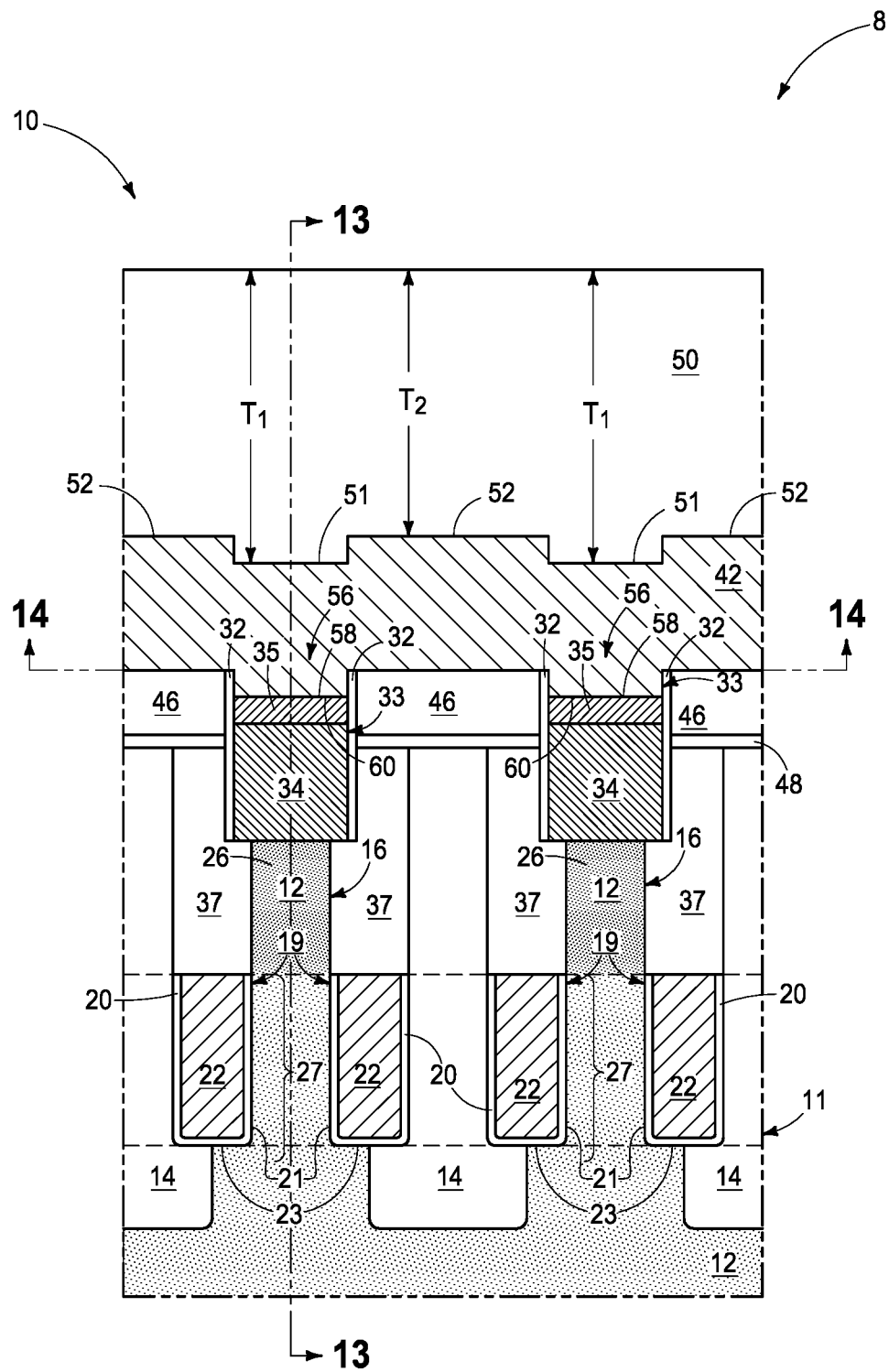
Figure 16:
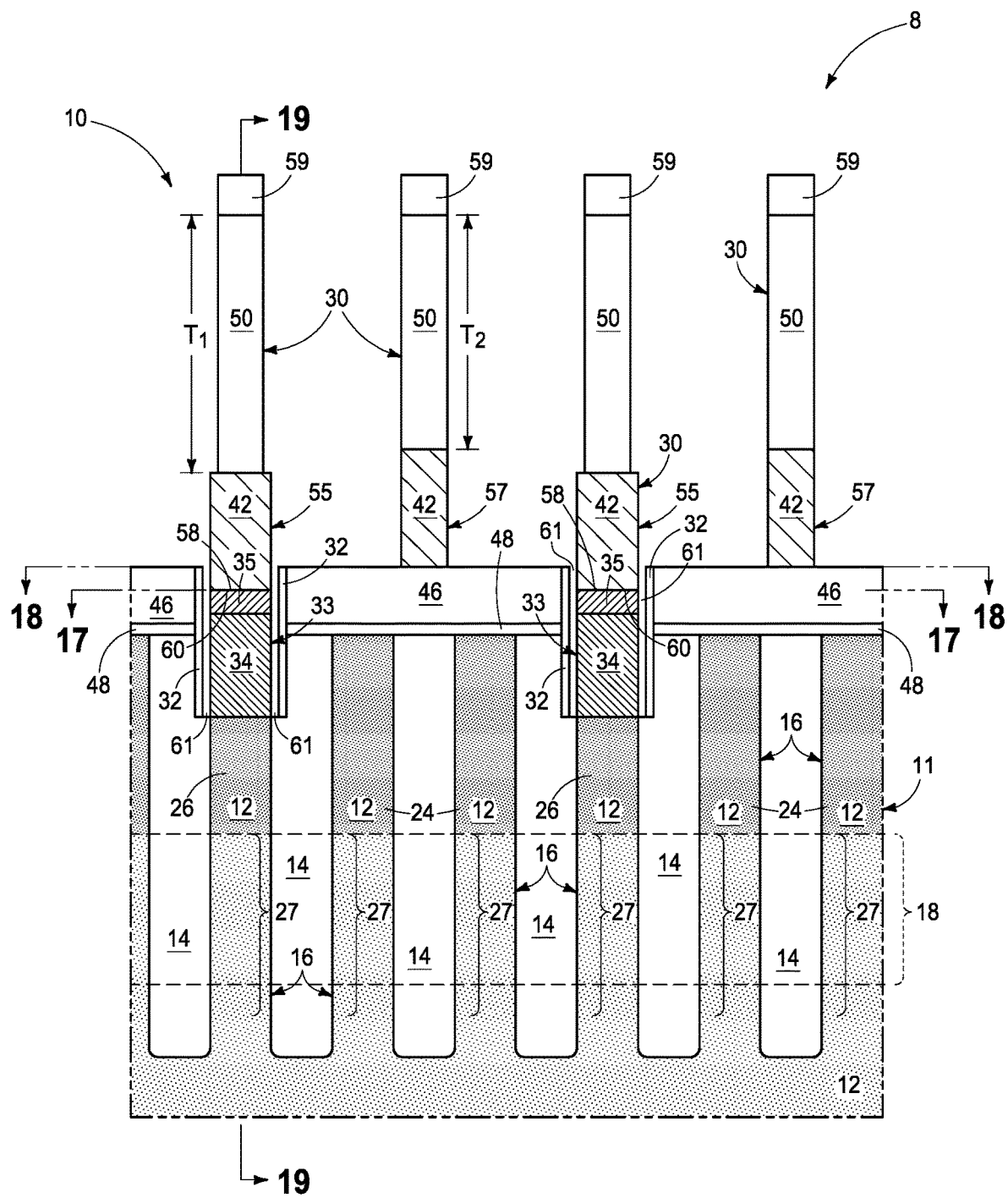
Figure 17:
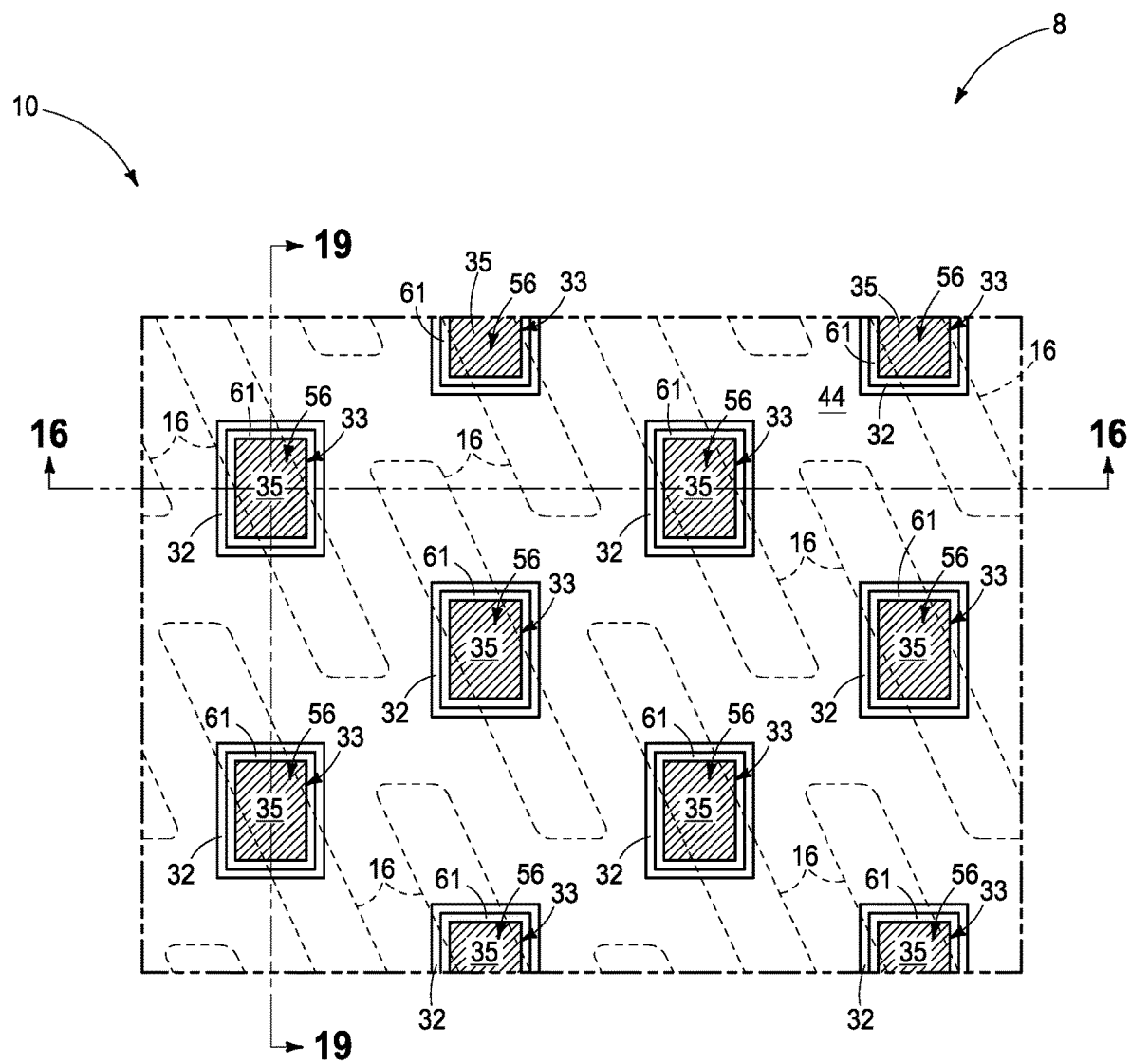
Figure 18:
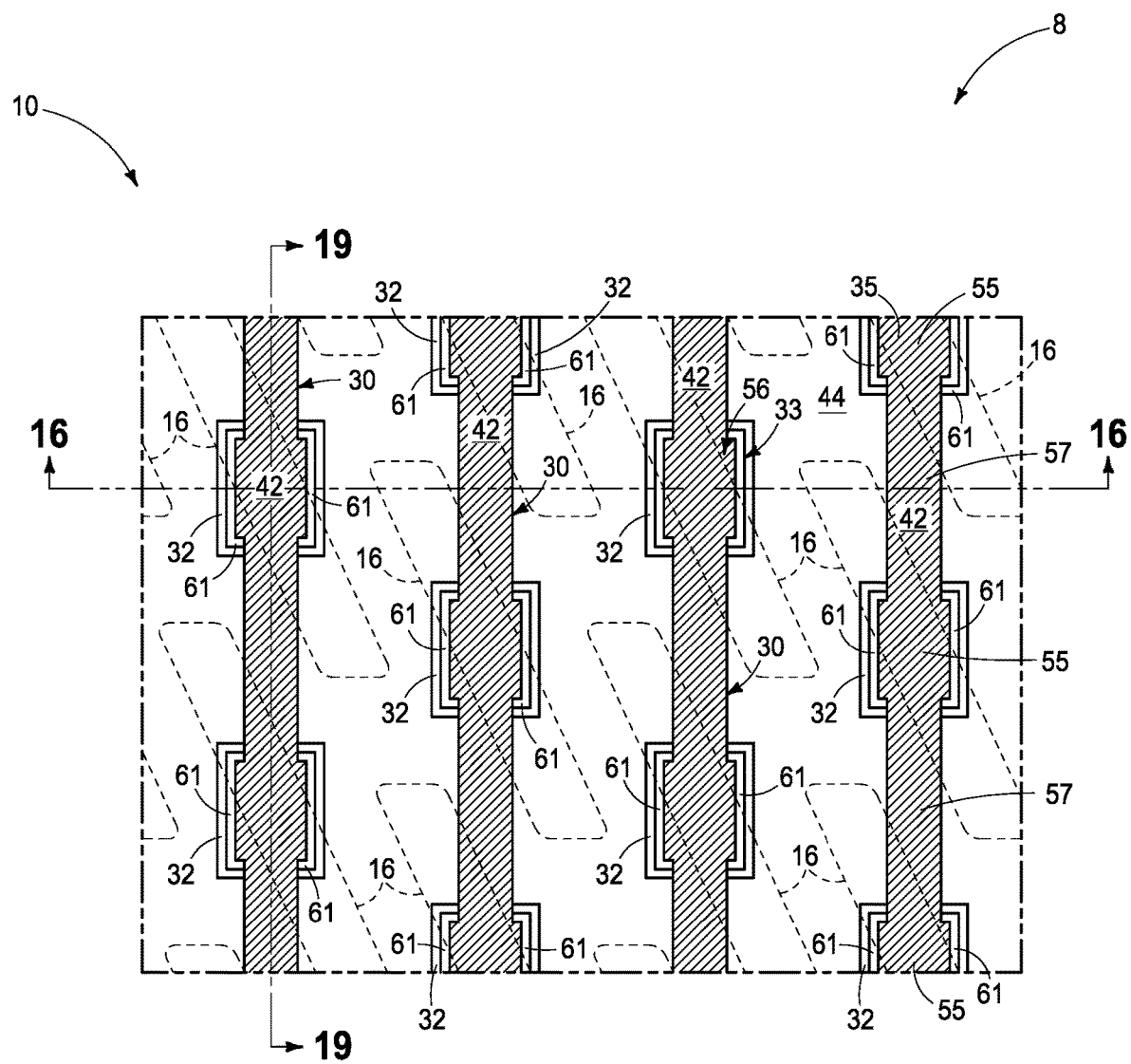
Figure 19:
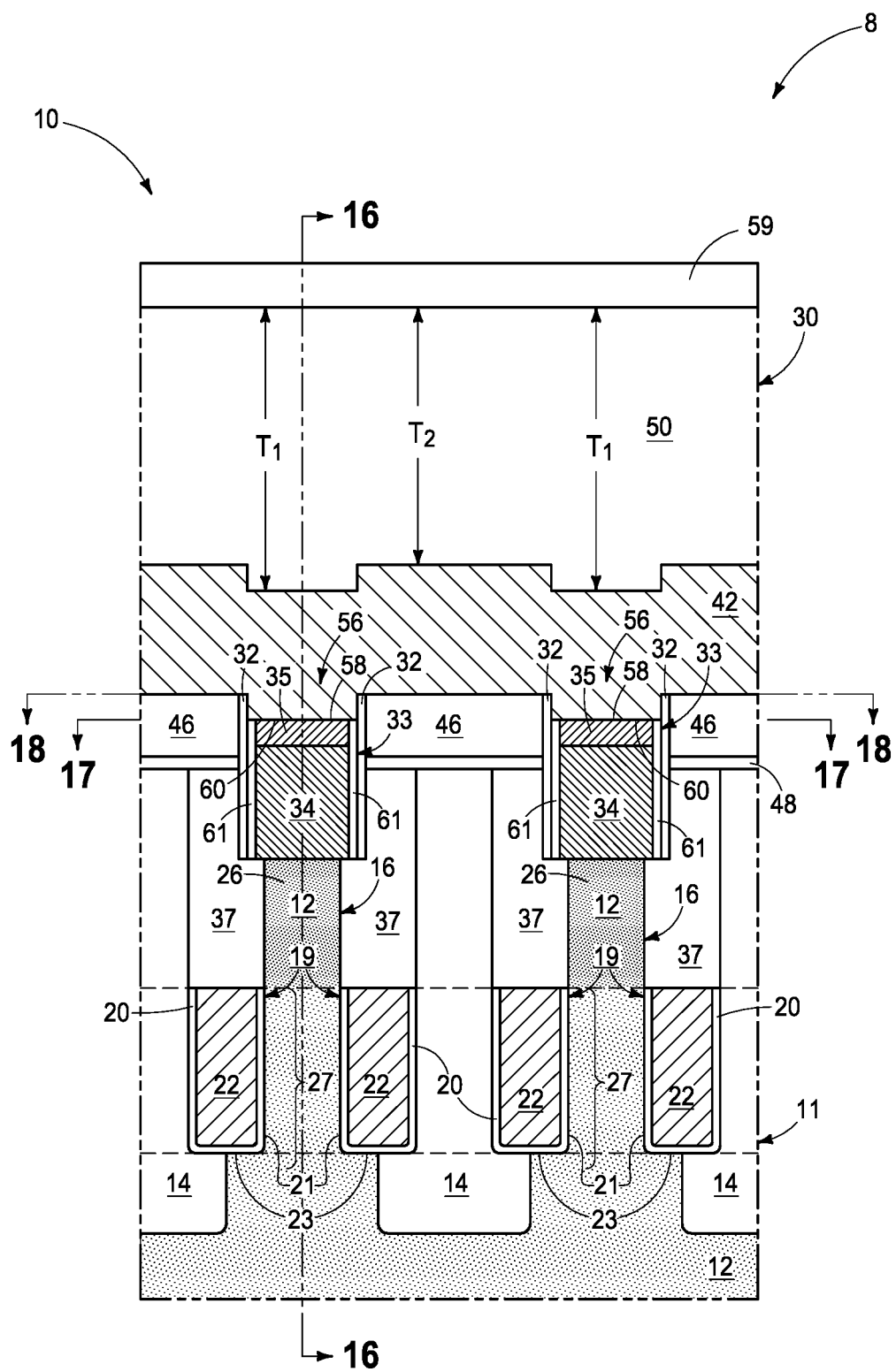
Figure 20:
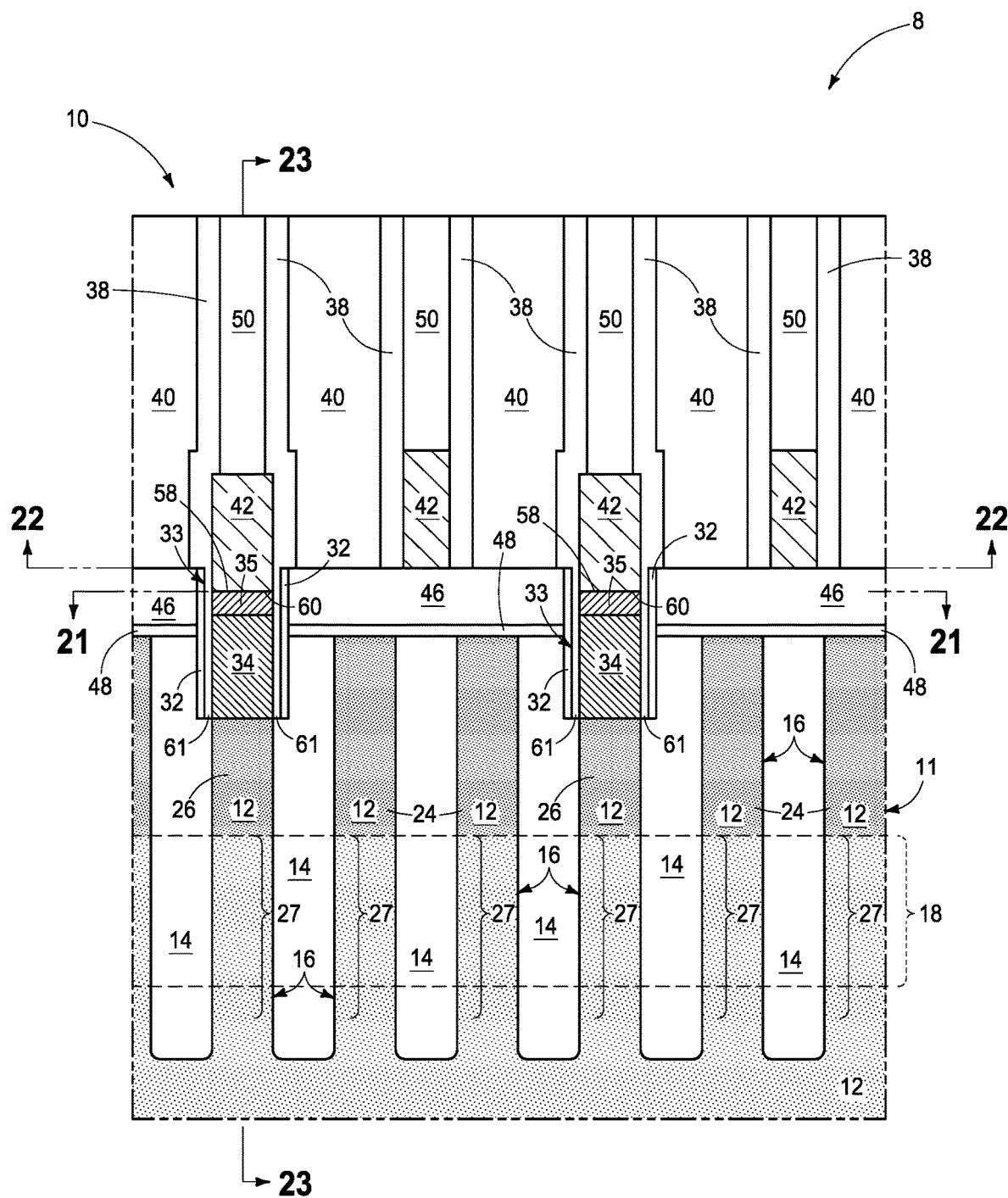
Figure 21:
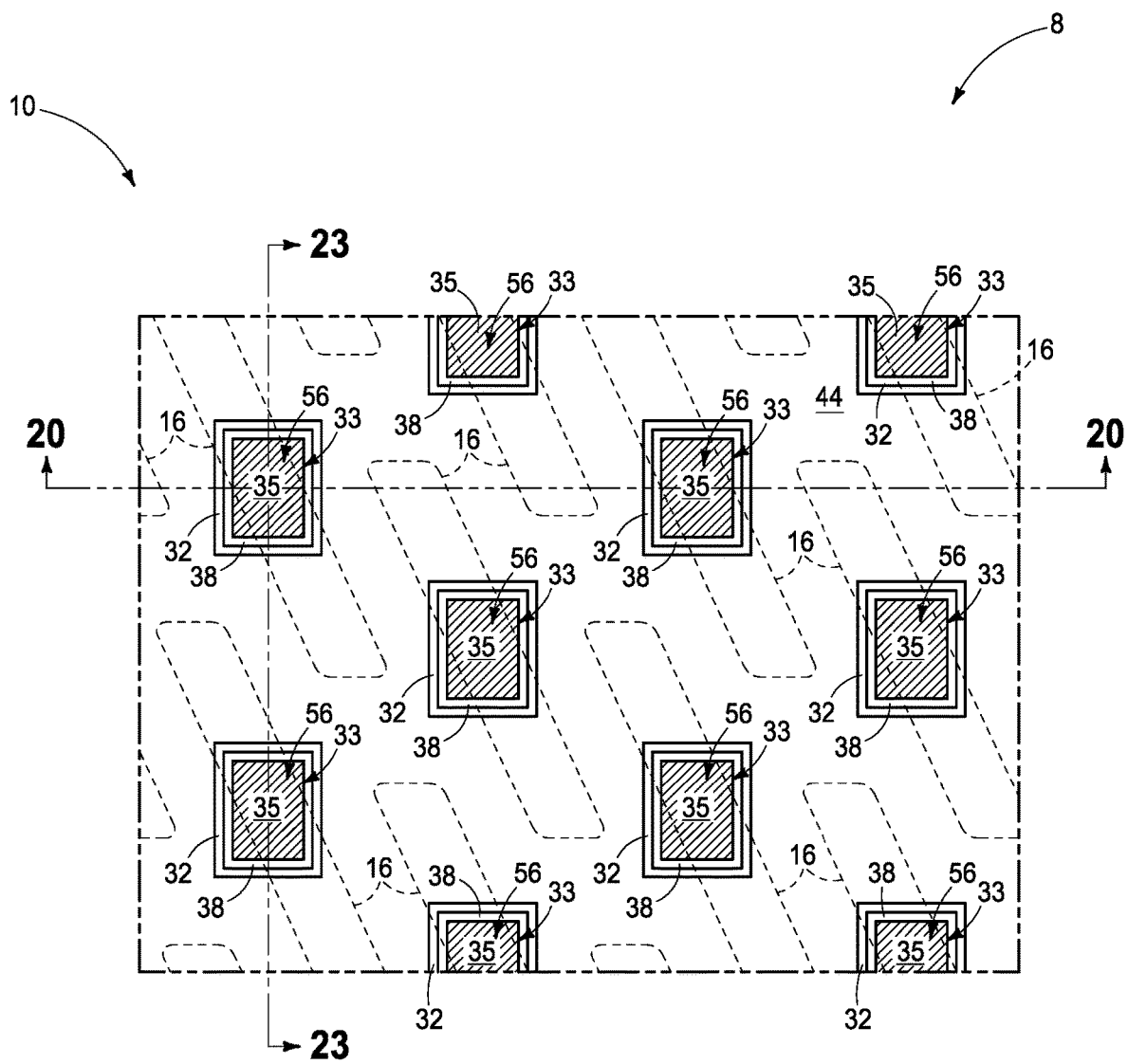
Figure 22:
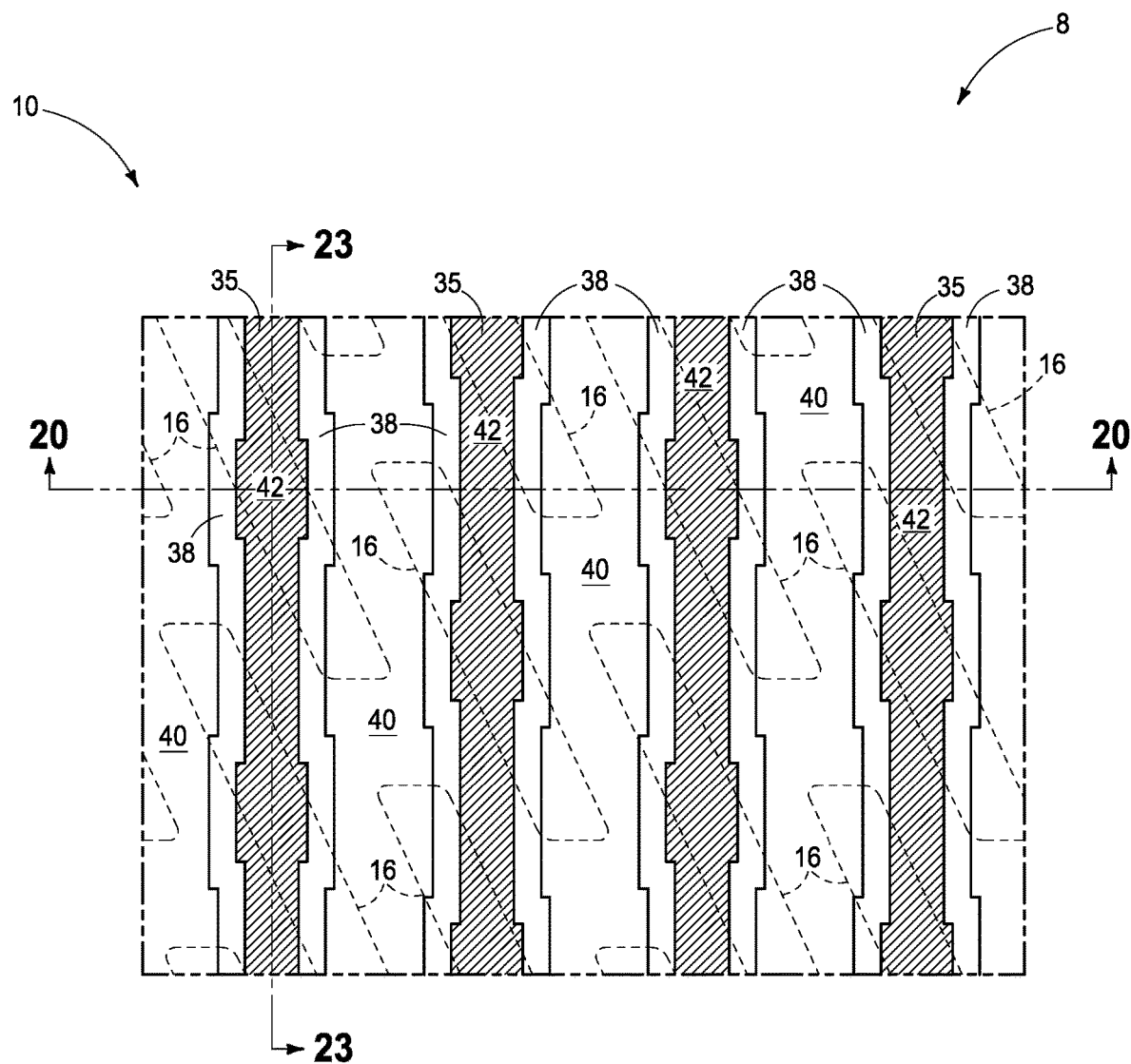
Figure 23:
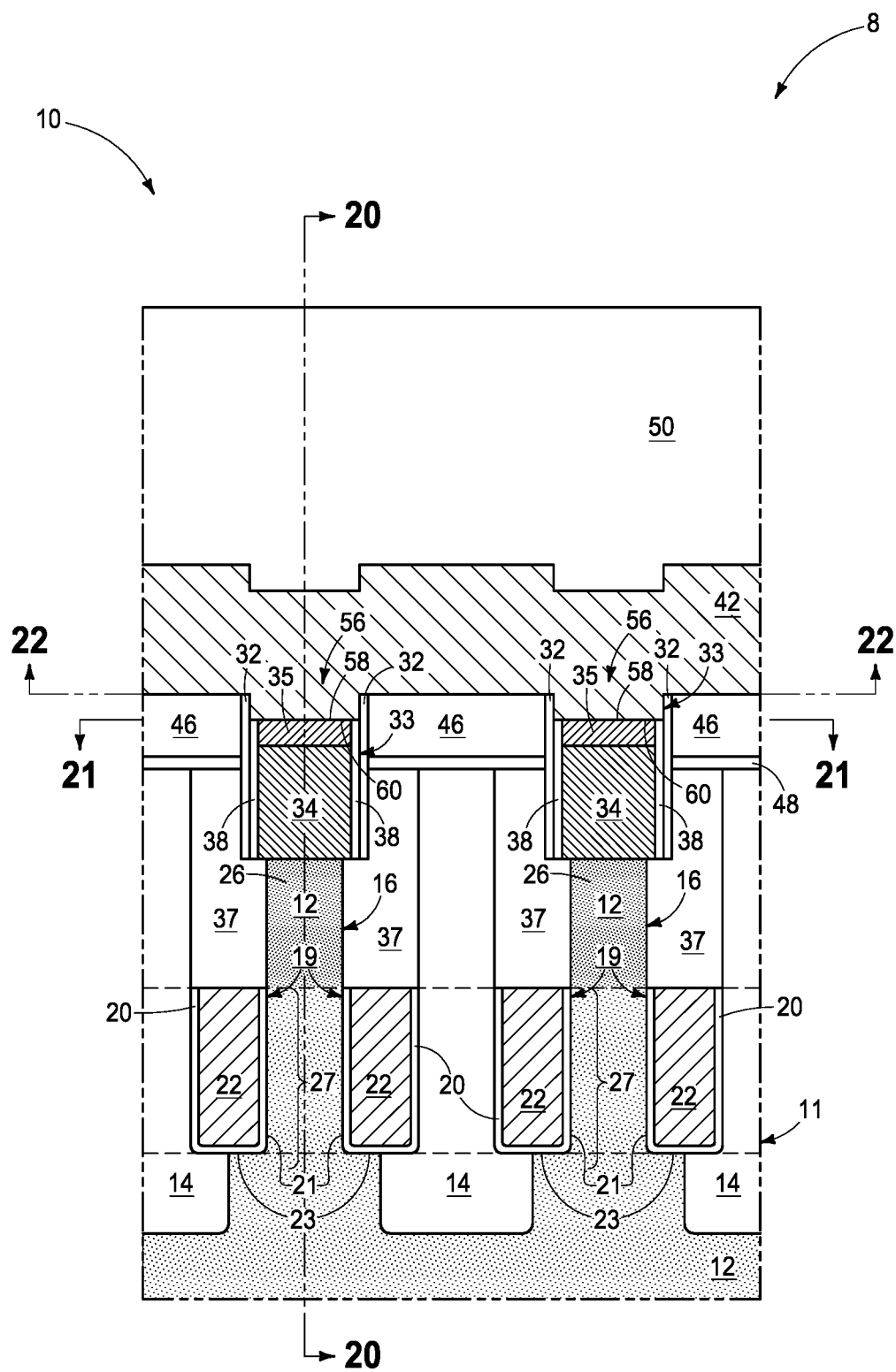

Referring to FIGS. 13-15, conducting material 42 has been formed directly above and directly against vertically-recessed conductive vias 33. Conducting material 42 has top surfaces 51 that are lower directly above vertically-recessed conductive vias 33 than higher top surfaces 52 that are laterally-adjacent vertically-recessed conductive vias 33. Masking material 50 (e.g., insulative silicon nitride or other material) has been formed directly above conducting material 42. Masking material 50 is vertically thicker (e.g., $T_1$) directly above lower top surfaces 51 than directly above higher top surfaces 52 laterally-adjacent thereto (e.g., $T_2$). Masking material 50, which may or may not at least partially remain as part of the finished circuitry construction, may be initially deposited to not be so vertically thicker and thinner, and the depicted construction may thereafter result by subjecting masking material 50 to a planarizing step (e.g., mechanical polishing or chemical mechanical polishing).

Referring to FIGS. 16-19, masking material 50 and conductive material 42 have been patterned (e.g., using photolithography patterning and etch using masking blocks 59 [e.g., photoresist]) to form individual conductive line structures 30 that are individually directly above a plurality of vertically-recessed conductive vias 33 that are spaced longitudinally-along the respective individual conductive line structures 30. In one embodiment and as a result of or as an artifact from presence of vertically-thicker masking material (e.g., $T_1$), such forms individual conductive line structures 30 to have longitudinally-alternating wider and narrower regions 55, 57, respectively, of conducting material 42. Wider regions 55 of conducting material 42 are directly above and directly against lower top surface 58 of individual vertically-recessed conductive vias 33 and are wider in a horizontal cross-section that is at vertically-recessed conductive-via lower top surface 58 (e.g., FIG. 18) than are narrower regions 57 of conducting material 42 in the horizontal cross-section. Narrower regions 57 of conducting material 42 are longitudinally-between wider regions 55 of conducting material 42. Such act of patterning masking material 50 and conducting material 42 may form a circumferential gap 61 about individual conductive vias 33.

Figure 24:
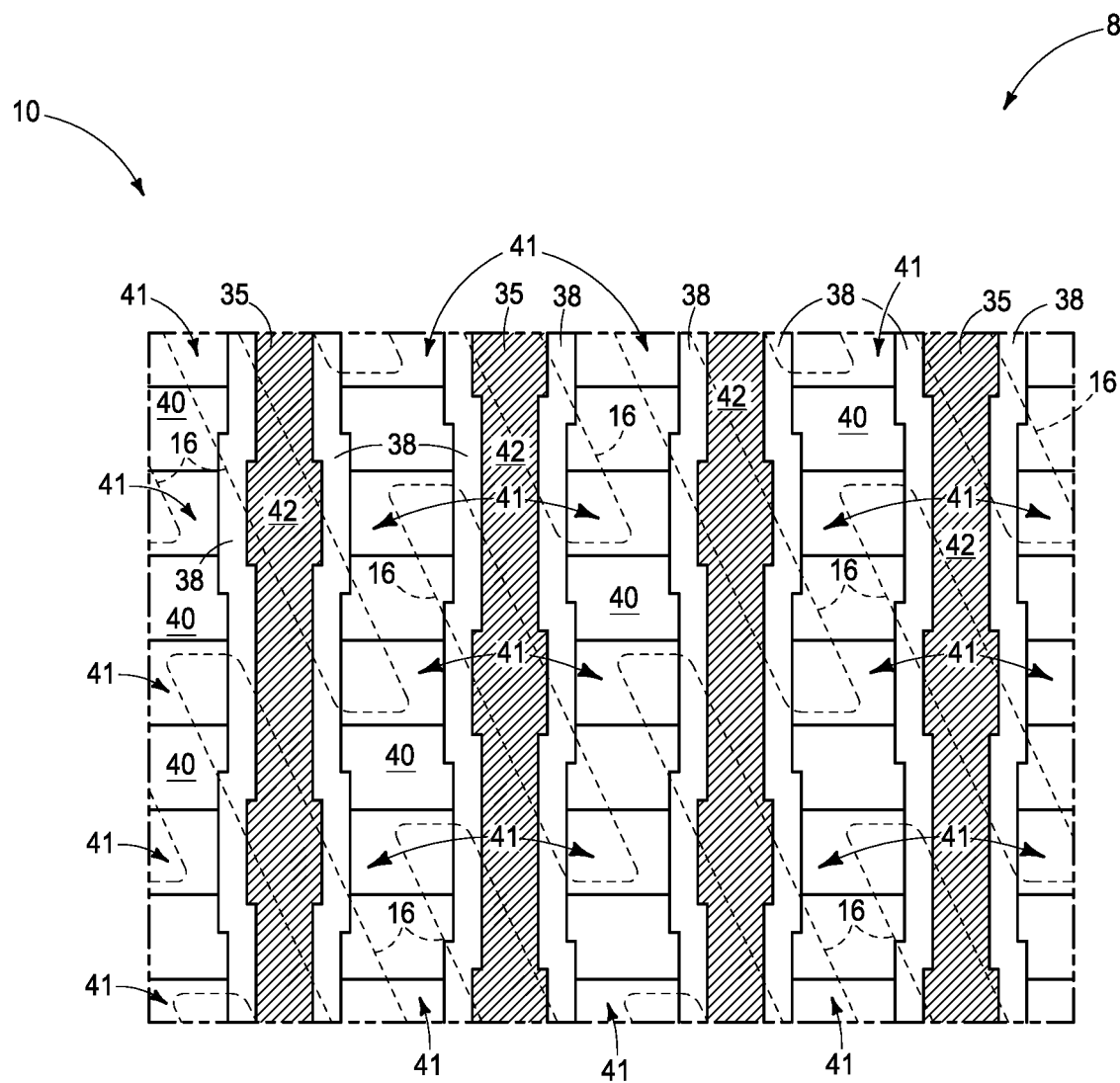

Referring to FIGS. 20-23, insulative spacers 38 have been formed (thus expanding size of digitline structures 30) and dielectric material 40 has been deposited there-between. Insulative spacers 38 may fill circumferential gaps 61 as shown. FIG. 24 shows subsequent forming of openings 41 there-through to source/drain regions 24. Subsequent processing would occur to produce the construction as shown in FIGS. 1-7. For example, conductor vias 36 would be formed in openings 41 to be individually directly electrically coupled to other source/drain regions 24 of the pairs of source/drain regions. A storage element, such as a capacitor 85, would be formed to be directly electrically coupled to individual of conductor vias 36.

Any other attribute(s) or aspect(s) as shown and/or described herein with respect to other embodiments may be used.

Embodiments of the invention encompass a method used in forming integrated circuitry that may or may not be or comprise memory circuitry. Such a method comprises forming horizontally-spaced conductive vias (e.g., 33) above a substrate (e.g., those portions of materials 12 and 14 that are below conductive vias 33). Conducting material (e.g., 42) is formed directly above and directly against the conductive vias. The conducting material is patterned (regardless of presence of material 50) to form individual conductive lines (e.g., 39) that are individually directly above a plurality of the conductive vias that are spaced longitudinally-along the respective individual conductive line. The patterning forms the individual conductive lines to have longitudinally-alternating wider and narrower regions (e.g., 55, 57, respectively). The wider regions are directly above and directly against a top surface (e.g., 58) of individual of the conductive vias and are wider in a horizontal cross-section that is at the top surface (e.g., that of FIG. 18) than are the narrower regions in the horizontal cross-section. The narrower regions are longitudinally-between the wider regions. Any other attribute(s) or aspect(s) as shown and/or described herein with respect to other embodiments may be used.

The above processing(s) or construction(s) may be considered as being relative to an array of components formed as or within a single stack or single deck of such components above or as part of an underlying base substrate (albeit, the single stack/deck may have multiple tiers). Control and/or other peripheral circuitry for operating or accessing such components within an array may also be formed anywhere as part of the finished construction, and in some embodiments may be under the array (e.g., CMOS under-array). Regardless, one or more additional such stack(s)/deck(s) may be provided or fabricated above and/or below that shown in the figures or described above. Further, the array(s) of components may be the same or different relative one another in different stacks/decks and different stacks/decks may be of the same thickness or of different thicknesses relative one another. Intervening structure may be provided between immediately-vertically-adjacent stacks/decks (e.g., additional circuitry and/or dielectric layers). Also, different stacks/decks may be electrically coupled relative one another. The multiple stacks/decks may be fabricated separately and sequentially (e.g., one atop another), or two or more stacks/decks may be fabricated at essentially the same time.

The assemblies and structures discussed above may be used in integrated circuits/circuitry and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

In this document unless otherwise indicated, "elevational", "higher", "upper", "lower", "top", "atop", "bottom", "above", "below", "under", "beneath", "up", and "down" are generally with reference to the vertical direction. "Horizontal" refers to a general direction (i.e., within 10 degrees) along a primary substrate surface and may be relative to which the substrate is processed during fabrication, and vertical is a direction generally orthogonal thereto. Reference to "exactly horizontal" is the direction along the primary substrate surface (i.e., no degrees there-from) and may be relative to which the substrate is processed during fabrication. Further, "vertical" and "horizontal" as used herein are generally perpendicular directions relative one another and independent of orientation of the substrate in three-dimensional space. Additionally, "elevationally-extending" and "extend(ing) elevationally" refer to a direction that is angled away by at least 45° from exactly horizontal. Further, "extend(ing) elevationally", "elevationally-extending", "extend(ing) horizontally", "horizontally-extending" and the like with respect to a field effect transistor are with reference to orientation of the transistor's channel length along which current flows in operation between the source/drain regions. For bipolar junction transistors, "extend(ing) elevationally" "elevationally-extending", "extend(ing) horizontally", "horizontally-extending" and the like, are with reference to orientation of the base length along which current flows in operation between the emitter and collector. In some embodiments, any component, feature, and/or region that extends elevationally extends vertically or within 10° of vertical.

Further, "directly above", "directly below", and "directly under" require at least some lateral overlap (i.e., horizontally) of two stated regions/materials/components relative one another. Also, use of "above" not preceded by "directly" only requires that some portion of the stated region/material/component that is above the other be elevationally outward of the other (i.e., independent of whether there is any lateral overlap of the two stated regions/materials/components). Analogously, use of "below" and "under" not preceded by "directly" only requires that some portion of the stated region/material/component that is below/under the other be elevationally inward of the other (i.e., independent of whether there is any lateral overlap of the two stated regions/materials/components).

Any of the materials, regions, and structures described herein may be homogenous or non-homogenous, and regardless may be continuous or discontinuous over any material which such overlie. Where one or more example composition(s) is/are provided for any material, that material may comprise, consist essentially of, or consist of such one or more composition(s). Further, unless otherwise stated, each material may be formed using any suitable existing or future-developed technique, with atomic layer deposition, chemical vapor deposition, physical vapor deposition, epitaxial growth, diffusion doping, and ion implanting being examples.

Additionally, "thickness" by itself (no preceding directional adjective) is defined as the mean straight-line distance through a given material or region perpendicularly from a closest surface of an immediately-adjacent material of different composition or of an immediately-adjacent region. Additionally, the various materials or regions described herein may be of substantially constant thickness or of variable thicknesses. If of variable thickness, thickness refers to average thickness unless otherwise indicated, and such material or region will have some minimum thickness and some maximum thickness due to the thickness being variable. As used herein, "different composition" only requires those portions of two stated materials or regions that may be directly against one another to be chemically and/or physically different, for example if such materials or regions are not homogenous. If the two stated materials or regions are not directly against one another, "different composition" only requires that those portions of the two stated materials or regions that are closest to one another be chemically and/or physically different if such materials or regions are not homogenous. In this document, a material, region, or structure is "directly against" another when there is at least some physical touching contact of the stated materials, regions, or structures relative one another. In contrast, "over", "on", "adjacent", "along", and "against" not preceded by "directly" encompass "directly against" as well as construction where intervening material(s), region(s), or structure(s) result(s) in no physical touching contact of the stated materials, regions, or structures relative one another.

Herein, regions-materials-components are "electrically coupled" relative one another if in normal operation electric current is capable of continuously flowing from one to the other and does so predominately by movement of subatomic positive and/or negative charges when such are sufficiently generated. Another electronic component may be between and electrically coupled to the regions-materials-components. In contrast, when regions-materials-components are referred to as being "directly electrically coupled", no intervening electronic component (e.g., no diode, transistor, resistor, transducer, switch, fuse, etc.) is between the directly electrically coupled regions-materials-components.

Any use of "row" and "column" in this document is for convenience in distinguishing one series or orientation of features from another series or orientation of features and along which components have been or may be formed. "Row" and "column" are used synonymously with respect to any series of regions, components, and/or features independent of function. Regardless, the rows may be straight and/or curved and/or parallel and/or not parallel relative one another, as may be the columns. Further, the rows and columns may intersect relative one another at 90° or at one or more other angles (i.e., other than the straight angle).

The composition of any of the conductive/conductor/conducting materials herein may be metal material and/or conductively-doped semiconductive/semiconductor/semiconducting material. "Metal material" is any one or combination of an elemental metal, any mixture or alloy of two or more elemental metals, and any one or more conductive metal compound(s).

Herein, any use of "selective" as to etch, etching, removing, removal, depositing, forming, and/or formation is such an act of one stated material relative to another stated material(s) so acted upon at a rate of at least 2:1 by volume. Further, any use of selectively depositing, selectively growing, or selectively forming is depositing, growing, or forming one material relative to another stated material or materials at a rate of at least 2:1 by volume for at least the first 75 Angstroms of depositing, growing, or forming.

Unless otherwise indicated, use of "or" herein encompasses either and both.

CONCLUSION

In some embodiments, a method used in forming integrated circuitry comprises forming horizontally-spaced conductive vias above a substrate. Conducting material is formed directly above and directly against the conductive vias. The conducting material is patterned to form individual conductive lines that are individually directly above a plurality of the conductive vias that are spaced longitudinally-along the respective individual conductive line. The patterning forms the individual conductive lines to have longitudinally-alternating wider and narrower regions. The wider regions are directly above and directly against a top surface of individual of the conductive vias and are wider in a horizontal cross-section that is at the top surface than are the narrower regions in the horizontal cross-section. The narrower regions are longitudinally-between the wider regions.

In some embodiments, a method used in forming memory circuitry comprises forming transistors individually comprising a pair of source/drain regions; a channel region between the pair of source/drain regions; and a conductive gate operatively proximate the channel region. Horizontally-spaced conductive vias are formed that are individually directly electrically coupled to one of the pair of source/drain regions of multiple of the transistors. The conductive vias are vertically recessed to individually have a top surface that is lower than that of laterally-surrounding material. Conducting material is formed directly above and directly against the vertically-recessed conductive vias. The conducting material has top surfaces that are lower directly above the vertically-recessed conductive vias than higher top surfaces that are laterally-adjacent the vertically-recessed conductive vias. Masking material is formed directly above the conducting material. The masking material is vertically thicker directly above the lower top surfaces than directly above the higher top surfaces laterally-adjacent thereto. The masking material and the conducting material are patterned to form individual conductive line structures that are individually directly above a plurality of the vertically-recessed conductive vias that are spaced longitudinally-along the respective individual conductive line structure. The vertically-thicker masking material forms the individual conductive line structures to have longitudinally-alternating wider and narrower regions of the conducting material. The wider regions of the conducting material are directly above and directly against the lower top surface of individual of the vertically-recessed conductive vias and are wider in a horizontal cross-section that is at the vertically-recessed conductive-via lower top surface than are the narrower regions of the conducting material in the horizontal cross-section. The narrower regions of the conducting material are longitudinally-between the wider regions of the conducting material. Conductor vias are formed laterally between and spaced longitudinally along the digitline structures. Individual of the conductive vias are directly electrically coupled to the other source/drain region of the pair of source/drain regions of the multiple transistors. A plurality of storage elements is formed that are individually directly electrically coupled to individual of the conductor vias.

In some embodiments, integrated circuitry comprises horizontally-spaced conductive vias above a substrate. A plurality of conductive lines are individually directly above a plurality of the conductive vias that are spaced longitudinally-along the respective individual conductive line. Individual of the conductive lines have longitudinally-alternating wider and narrower regions. The wider regions are directly above and directly against a top surface of individual of the conductive vias and are wider in a horizontal cross-section that is at the top surface than are the narrower regions in the horizontal cross-section. The narrower regions are longitudinally-between the wider regions.

In some embodiments, memory circuitry comprises a substrate comprising transistors individually comprising a pair of source/drain regions; a channel region between the pair of source/drain regions; and a conductive gate operatively proximate the channel region. Horizontally-spaced conductive vias are individually directly electrically coupled to one of the pair of source/drain regions of multiple of the transistors. Digitline structures are individually directly electrically coupled to a plurality of the conductive vias along a line of the multiple transistors. Individual of the digitline structures have longitudinally-alternating wider and narrower regions of conducting material. The wider regions are directly above and directly against a top surface of individual of the conductive vias and are wider in a horizontal cross-section that is at the top surface than are the narrower regions in the horizontal cross-section. The narrower regions are longitudinally-between the wider regions. Conductor vias are laterally between and spaced longitudinally along the digitline structures. Individual of the conductive vias are directly electrically coupled to the other source/drain region of the pair of source/drain regions of the multiple transistors. A plurality of storage elements that are individually directly electrically coupled to individual of the conductor vias.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A method used in forming integrated circuitry, comprising:
    forming horizontally-spaced conductive vias above a substrate;
    forming conducting material directly above and directly against the conductive vias;
    patterning the conducting material to form individual conductive lines that are individually directly above a plurality of the conductive vias that are spaced longitudinally-along the respective individual conductive line; and
    the patterning forming the individual conductive lines to have longitudinally-alternating wider and narrower regions, the wider regions being directly above and directly against a top surface of individual of the conductive vias and being wider in a horizontal cross-section that is at the top surface than are the narrower regions in the horizontal cross-section, the narrower regions being longitudinally-between the wider regions.

2. The method of claim 1 comprising, prior to forming the conducting material, vertically-recessing the individual conductive vias to have a top surface that is lower than laterally-surrounding material.

3. The method of claim 1 comprising forming masking material directly above the conducting material, the masking material being vertically thicker directly above the individual conductive vias than directly above material that laterally surrounds the individual conductive vias.

4. The method of claim 3 wherein at least some of the masking material remains in a finished construction of the integrated circuitry.

5. The method of claim 4 wherein said at least some is insulative.

6. The method of claim 1 wherein the conductive lines are digitlines of memory circuitry.

7. The method of claim 6 comprising forming a plurality of storage elements that are individually at least part of a memory cell of the memory circuitry.

8. The method of claim 6 wherein the memory circuitry comprises DRAM.

9. The method of claim 1 comprising forming the individual conductive lines to have an undulating top surface.

10. The method of claim 9 wherein highest portions of the undulating top surface are directly above the narrower regions.

11. The method of claim 10 wherein the highest portions of the undulating top surface are not directly above the wider regions.

12. A method used in forming memory circuitry, comprising:
    forming transistors individually comprising:
        a pair of source/drain regions;
        a channel region between the pair of source/drain regions; and
        a conductive gate operatively proximate the channel region;
    forming horizontally-spaced conductive vias that are individually directly electrically coupled to one of the pair of source/drain regions of multiple of the transistors;
    vertically recessing the conductive vias to individually have a top surface that is lower than that of laterally-surrounding material;
    forming conducting material directly above and directly against the vertically-recessed conductive vias, the conducting material having top surfaces that are lower directly above the vertically-recessed conductive vias than higher top surfaces that are laterally-adjacent the vertically-recessed conductive vias;
    forming masking material directly above the conducting material, the masking material being vertically thicker directly above the lower top surfaces than directly above the higher top surfaces laterally-adjacent thereto;
    patterning the masking material and the conducting material to form individual conductive line structures that are individually directly above a plurality of the vertically-recessed conductive vias that are spaced longitudinally-along the respective individual conductive line structure, the vertically-thicker masking material forming the individual conductive line structures to have longitudinally-alternating wider and narrower regions of the conducting material, the wider regions of the conducting material being directly above and directly against the lower top surface of individual of the vertically-recessed conductive vias and being wider in a horizontal cross-section that is at the vertically-recessed conductive-via lower top surface than are the narrower regions of the conducting material in the horizontal cross-section, the narrower regions of the conducting material being longitudinally-between the wider regions of the conducting material;
    forming conductor vias laterally between and spaced longitudinally along the digitline structures, individual of the conductive vias being directly electrically coupled to the other source/drain region of the pair of source/drain regions of the multiple transistors; and
    forming a plurality of storage elements that are individually directly electrically coupled to individual of the conductor vias.

13. The method of claim 12 wherein at least some of the masking material remains in a finished construction of the memory circuitry.

14. The method of claim 13 wherein said at least some is insulative.

15. The method of claim 12 wherein the memory circuitry comprises DRAM.

* * * * *